(12) United States Patent
Fairbairn et al.

(10) Patent No.: US 11,610,761 B2
(45) Date of Patent: *Mar. 21, 2023

(54) SYNCHRONIZATION BETWEEN AN EXCITATION SOURCE AND A SUBSTRATE BIAS SUPPLY

(71) Applicant: Advanced Energy Industries, Inc., Fort Collins, CO (US)

(72) Inventors: Kevin Fairbairn, Los Gatos, CA (US); Denis Shaw, Fort Collins, CO (US); Daniel Carter, Fort Collins, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/150,633

(22) Filed: Jan. 15, 2021

(65) Prior Publication Data

US 2021/0134562 A1 May 6, 2021

Related U.S. Application Data

(63) Continuation of application No. 16/803,020, filed on Feb. 27, 2020, now Pat. No. 10,896,807, which is a
(Continued)

(51) Int. Cl.
*H01J 37/32* (2006.01)
*C23C 14/48* (2006.01)

(52) U.S. Cl.
CPC ........ *H01J 37/32146* (2013.01); *C23C 14/48* (2013.01); *H01J 37/3299* (2013.01); *H01J 37/32174* (2013.01); *H01J 37/32935* (2013.01)

(58) Field of Classification Search
CPC .......... H01J 37/32146; H01J 37/32174; H01J 37/32935; H01J 37/3299; H01J 37/32009;
(Continued)

(56) References Cited

U.S. PATENT DOCUMENTS 4,891,118 A 1/1990 Ooiwa et al.
6,162,709 A 12/2000 Raoux et al.
(Continued)

FOREIGN PATENT DOCUMENTS

| CN | 105097404 A | 11/2015 |
| TW | 201621974 A | 6/2016 |
| WO | 2014035889 A1 | 3/2014 |

OTHER PUBLICATIONS

EPO, "Extended European Search Report Regarding Patent Application No. 18877737.9", dated Mar. 25, 2021, p. 165, Published in: EP.

(Continued)

*Primary Examiner* — Renan Luque
(74) *Attorney, Agent, or Firm* — Neugeboren O'Dowd PC

(57) ABSTRACT

Systems and methods for plasma processing are disclosed. A method includes applying pulsed power to a plasma processing chamber with an excitation source during a first processing step with a first duty cycle and applying, during the first processing step, an asymmetric periodic voltage waveform to a substrate support to produce a first plasma sheath voltage between a substrate and a plasma. Pulsed power is applied to the plasma processing chamber with the excitation source during a second processing step with a second duty cycle and during the second processing step, a different asymmetric periodic voltage waveform is applied to the substrate support to produce a different plasma sheath voltage between the substrate and the plasma.

21 Claims, 25 Drawing Sheets

Related U.S. Application Data continuation of application No. 16/193,790, filed on Nov. 16, 2018, now Pat. No. 10,607,813.

(60) Provisional application No. 62/588,187, filed on Nov. 17, 2017.

(58) Field of Classification Search
CPC ... C23C 14/48; C23C 16/4586; C23C 16/509; C23C 16/52; C23C 16/45536; H01L 21/02274; H01L 21/3065; H01L 21/67069; H05H 1/46
See application file for complete search history.

(56) References Cited

U.S. PATENT DOCUMENTS

| | | | |
|---|---|---|---|
| 6,201,208 B1 | 3/2001 | Wendt et al. | |
| 6,621,674 B1 | 9/2003 | Zahringer et al. | |
| 6,885,453 B2 | 4/2005 | Kaumann | |
| 9,105,447 B2 | 8/2015 | Brouk et al. | |
| 9,283,635 B2 | 3/2016 | Peters | |
| 9,305,803 B2 | 4/2016 | Morimoto et al. | |
| 9,604,877 B2* | 3/2017 | Veerasamy | C23C 14/48 |
| 9,761,419 B2 | 9/2017 | Nagami | |
| 10,607,813 B2* | 3/2020 | Fairbairn | C23C 16/509 |
| 10,707,055 B2 | 7/2020 | Shaw et al. | |
| 10,896,807 B2* | 1/2021 | Fairbairn | C23C 16/52 |
| 11,189,454 B2 | 11/2021 | Carter et al. | |
| 2002/0115301 A1 | 8/2002 | Savas | |
| 2004/0007326 A1 | 1/2004 | Roche et al. | |
| 2005/0260354 A1 | 11/2005 | Singh et al. | |
| 2008/0135400 A1 | 6/2008 | Kadlec et al. | |
| 2009/0200494 A1 | 8/2009 | Hatem et al. | |
| 2009/0298287 A1 | 12/2009 | Shannon et al. | |
| 2010/0296977 A1 | 11/2010 | Hancock | |
| 2011/0248634 A1* | 10/2011 | Heil | H01J 37/32009 315/111.41 |
| 2013/0122711 A1* | 5/2013 | Marakhtanov | H01J 37/32165 438/711 |
| 2014/0061156 A1* | 3/2014 | Brouk | H01J 37/32146 216/61 |
| 2014/0062303 A1* | 3/2014 | Hoffman | H05H 1/46 315/111.21 |
| 2014/0302682 A1 | 10/2014 | Muto et al. | |
| 2014/0305905 A1 | 10/2014 | Yamada et al. | |
| 2015/0076112 A1 | 3/2015 | Sriraman et al. | |
| 2015/0315698 A1 | 11/2015 | Chistyakov | |
| 2016/0020108 A1* | 1/2016 | Ranjan | H01J 37/32165 438/714 |
| 2016/0027616 A1 | 1/2016 | Ramaswamy et al. | |
| 2016/0056017 A1 | 2/2016 | Kim et al. | |
| 2016/0126068 A1 | 5/2016 | Lee et al. | |
| 2016/0126069 A1 | 5/2016 | Kwon et al. | |
| 2016/0240353 A1 | 8/2016 | Nagami | |
| 2017/0099723 A1 | 4/2017 | Nagami et al. | |
| 2018/0342903 A1 | 11/2018 | Luu et al. | |
| 2019/0066979 A1 | 2/2019 | Shoeb et al. | |
| 2019/0180982 A1 | 6/2019 | Brouk et al. | |
| 2020/0090905 A1 | 3/2020 | Brouk et al. | |
| 2021/0005428 A1 | 1/2021 | Shaw et al. | |
| 2021/0013006 A1 | 1/2021 | Nguyen et al. | |
| 2021/0074513 A1 | 3/2021 | Van Zyl et al. | |
| 2021/0134562 A1 | 5/2021 | Fairbairn et al. | |
| 2021/0202209 A1 | 7/2021 | Van Zyl et al. | |
| 2021/0241996 A1 | 8/2021 | Carter et al. | |
| 2021/0327679 A1 | 10/2021 | Carter et al. | |
| 2021/0351007 A1 | 11/2021 | Carter | |

OTHER PUBLICATIONS

EPO, "Extended European Search Report Regarding Patent Application No. 18878531.5", dated Sep. 1, 2021, p. 126, Published in: EP.

Harry Kim, "International Search Report and Written Opinion Regarding International Application No. PCT/US2020/027927", dated Sep. 17, 2021, p. 14, Published in: US.

Fujimoto, Kayoko, "Notice for Reasons of Rejection Regarding Japanese Patent Application No. 2020-081092", dated Apr. 1, 2021, p. 6, Published in: JP.

Kudeka, Stephan, "Communication Pursuant to Article 94(3) EPC Regarding Application No. 10 770 205.2", dated Jun. 8, 2021, p. 6, Published in: EU.

Brayton, John Joseph, "Office Action Regarding U.S. Appl. No. 15/495,513", dated Apr. 14, 2021, p. 10, Published in: US.

Luque, Renan, "Office Action Regarding U.S. Appl. No. 16/896,709", dated May 25, 2021, p. 36, Published in: US.

Hammond, Crystal, "Office Action Regarding U.S. Appl. No. 17/031,027", dated Apr. 28, 2021, p. 9, Published in: US.

EPO, "Extended Search Report Regarding European Patent Appliication No. 18877322", , p. 129, Published in: EP.

SIPO, "Office Action Regarding Chinese Patent Application No. 201710704712.5", dated Apr. 1, 2020, p. 7, Published in: CN.

Brayton, John Joseph, "Office Action Regarding U.S. Appl. No. 15/667,239", dated Jun. 24, 2020, p. 131, Published in: US.

CNIPA, "Notification of the 3rd Office Action Issued in Application No. 201711336133.6", dated Oct. 10, 2020, p. 21, Published in: CN.

Kudelka, Stephan, "Communication Pursuant to Article 94(3) EPC Issued in Application No. 10 770 205.2", dated Oct. 23, 2020, p. 4, Published in: EP.

Brayton, John Joseph, "Office Action Regarding U.S. Appl. No. 15/495,513", dated Jul. 2, 2020, p. 87, Published in: US.

Luque, Renan, "Office Action Regarding U.S. Appl. No. 16/803,020", dated Apr. 22, 2020, p. 36, Published in: US.

Hammond, Crystal, "Office Action Regarding U.S. Appl. No. 16/246,996", dated Dec. 12, 2019, p. 84, Published in: US.

Taiwan Patent Office, "Office Action Regarding Application No. 107140924", dated Jan. 15, 2021, p. 12, Published in: TW.

TIPO, "Office Action Regarding Taiwan Patent Application No. 107140924", dated Apr. 28, 2020, p. 9, Published in: TW.

Hammond, Crystal, "Office Action Regarding U.S. Appl. No. 16/194,125", dated Dec. 12, 2019, p. 88, Published in: US.

Hammond, Crystal, "Office Action Regarding U.S. Appl. No. 16/270,391", dated Dec. 12, 2019, p. 78, Published in: US.

International Preliminary Report on Patentability Chapter I received for International PCT Application Serial No. PCT/US2020/041771 dated Jan. 27, 2022, 10 pages.

Non-Final Office Action received for U.S. Appl. No. 16/278,822 dated Aug. 2, 2021, 11 pages.

Non-Final Office Action received for U.S. Appl. No. 17/171,164 dated Oct. 15, 2021, 60 pages.

\* cited by examiner

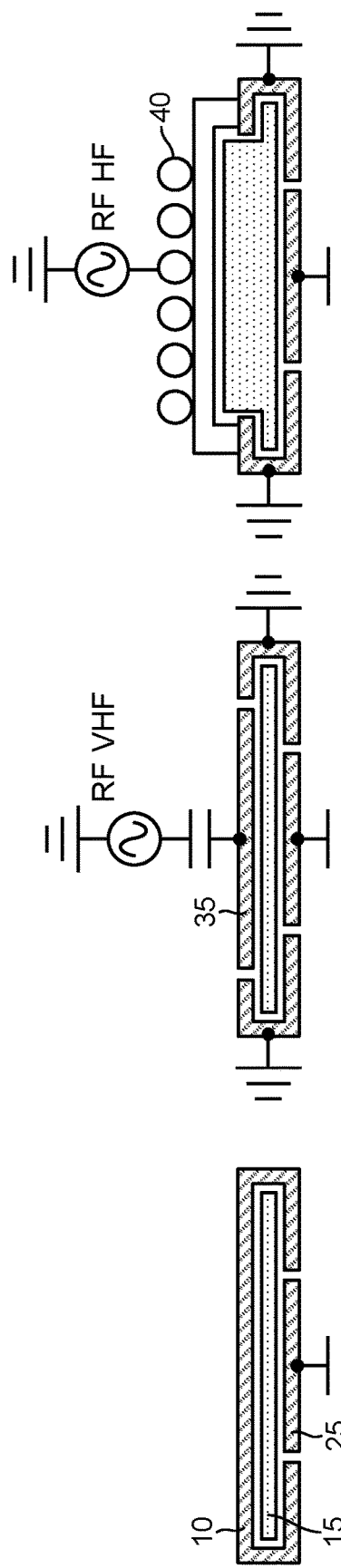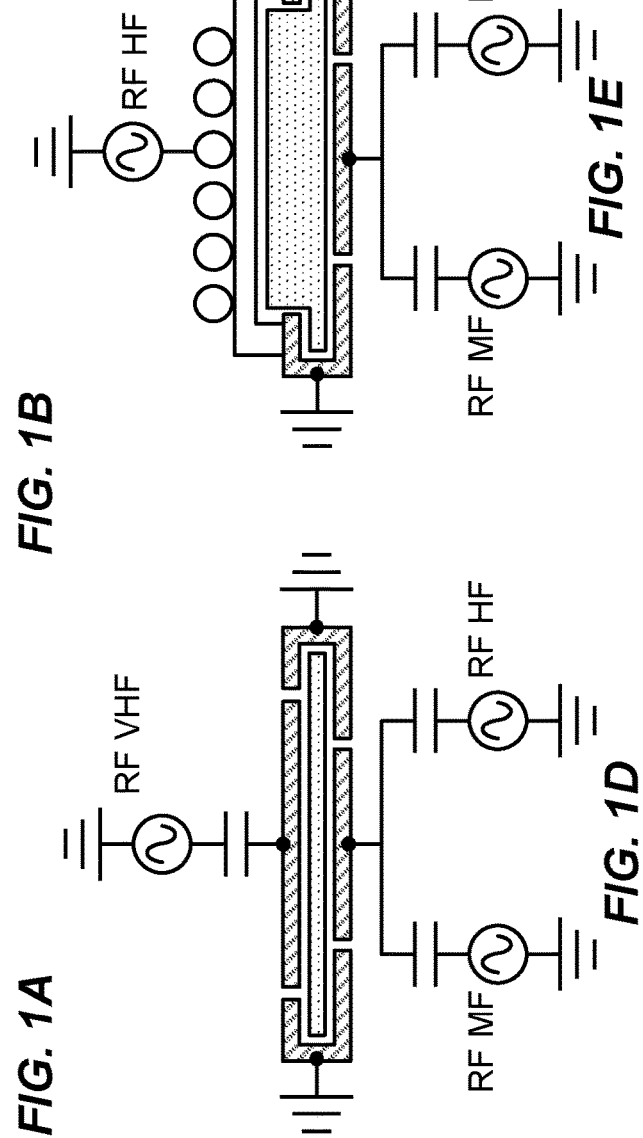

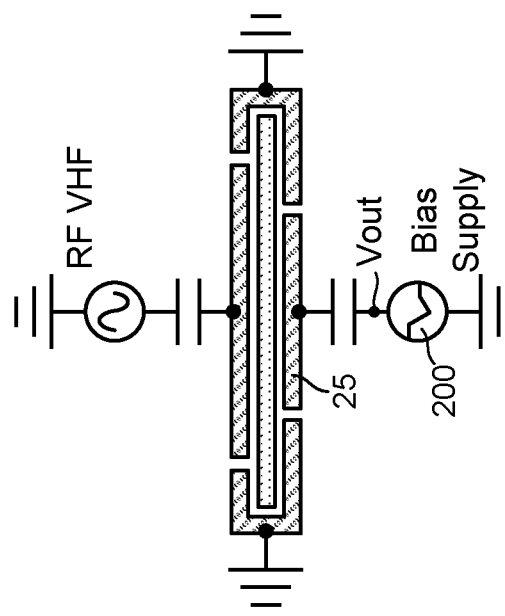
FIG. 6A
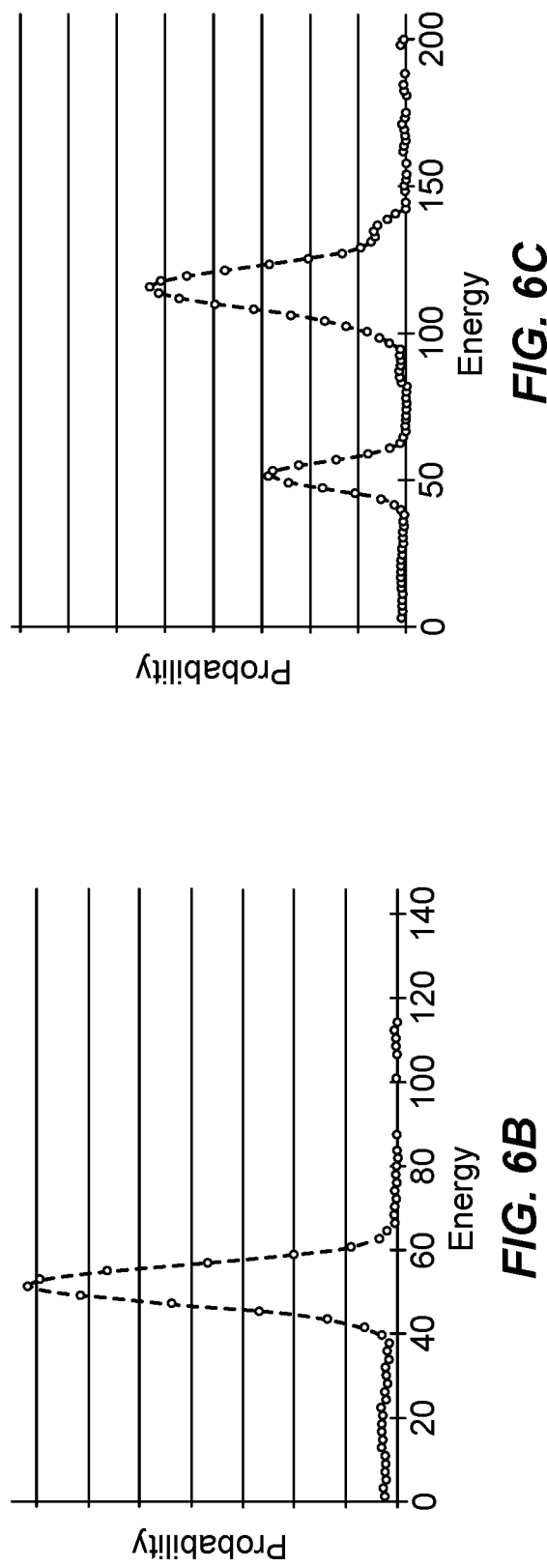
FIG. 6B
FIG. 6C

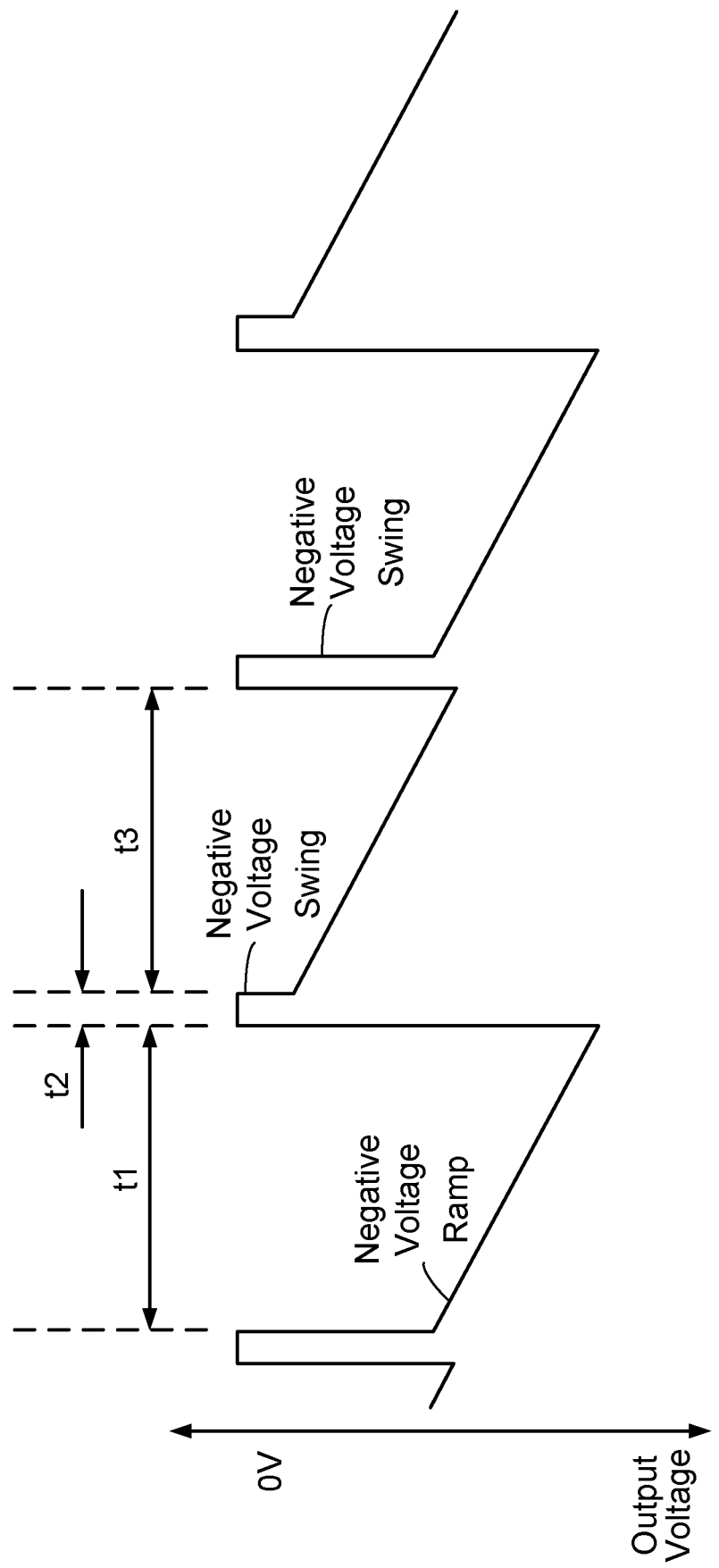

SYNCHRONIZATION BETWEEN AN EXCITATION SOURCE AND A SUBSTRATE BIAS SUPPLY

CLAIM OF PRIORITY UNDER 35 U.S.C. § 120

The present application for patent is a Continuation of patent application Ser. No. 16/803,020 entitled "SYNCHRONIZATION BETWEEN AN EXCITATION SOURCE AND A SUBSTRATE BIAS SUPPLY" filed Feb. 27, 2020 (pending and assigned to the assignee hereof and hereby expressly incorporated by reference herein), which is a Continuation of patent application Ser. No. 16/193,790 entitled "SYNCHRONIZED PULSING OF PLASMA PROCESSING SOURCE AND SUBSTRATE BIAS" filed Nov. 16, 2018 and issued as U.S. Pat. No. 10,604,813 on Mar. 31, 2020, which claims priority to Provisional Application No. 62/588,187 entitled "SYNCHRONIZED PULSING OF PLASMA PROCESSING SOURCE AND SUBSTRATE BIAS" filed Nov. 17, 2017, and assigned to the assignee hereof and hereby expressly incorporated by reference herein.

BACKGROUND

Field

The present disclosure relates generally to plasma processing. In particular, but not by way of limitation, the present disclosure relates to systems, methods and apparatuses for synchronizing pulsing of at least one plasma power source and at least one bias supply.

Background

In plasma processing systems, substrates (e.g., semiconductor wafers) are placed on RF biased substrate holders, such as electrostatic chucks (ESCs) or chucks provided with mechanical wafer clamps, where the substrates are exposed to ions from the plasma. Prior approaches attempt to control the energy of the ions (from the plasma) that are incident on the substrates by varying the RF bias power level while the ion density is usually controlled by control of an independent plasma source. The plasma source can be, for example, an inductively coupled plasma (ICP) source, a dual capacitively-coupled plasma source (CCP) having a secondary top electrode biased at another RF frequency, a helicon plasma source, a microwave plasma source, a magnetron, or some other independently operated source of plasma energy.

SUMMARY

An aspect may be characterized as a method for plasma processing. The method includes applying pulsed power to a plasma processing chamber with an excitation source during a first processing step with a first duty cycle and applying, during the first processing step, an asymmetric periodic voltage waveform to a substrate support to produce a first plasma sheath voltage between a substrate and a plasma. Pulsed power is applied to the plasma processing chamber with the excitation source during a second processing step with a second duty cycle and during the second processing step, a different asymmetric periodic voltage waveform is applied to the substrate support to produce a different plasma sheath voltage between the substrate and the plasma.

Another aspect may be characterized as a plasma processing system that includes a bias supply configured to apply and modify an asymmetric periodic voltage waveform to a substrate support to modify a plasma sheath voltage between the plasma and a substrate within a plasma processing chamber. The plasma processing system also includes at least one controller configured to synchronize the bias supply with an excitation source during a first processing step to produce a plasma sheath voltage while the excitation source is producing pulsed power with a first duty cycle. The at least one controller is also configured to synchronize the bias supply with the excitation source during a second processing step while the excitation source is producing pulsed power with a second duty cycle and apply the asymmetric periodic voltage waveform to produce a different magnitude of the plasma sheath voltage during the second processing step.

Yet another aspect is a non-transitory computer-readable medium comprising instructions stored thereon, for execution by a processor, or for configuring a field programmable gate array, to perform plasma processing. The instructions include instructions to apply pulsed power to a plasma processing chamber with an excitation source during a first processing step with a first duty cycle and instructions to apply, during the first processing step, an asymmetric periodic voltage waveform to a substrate support to produce a first plasma sheath voltage between a substrate and a plasma. The instructions also include instructions to apply pulsed power to the plasma processing chamber with the excitation source during a second processing step with a second duty cycle and instructions to apply, during the second processing step, a different asymmetric periodic voltage waveform to the substrate support to produce a different plasma sheath voltage between the substrate and the plasma.

BRIEF DESCRIPTION OF THE DRAWINGS

FIG. 1A depicts a plasma processing system with a single high frequency RF excitation source;

FIG. 1B depicts a plasma processing system with two RF excitation sources;

FIG. 1C depicts a plasma processing system with an inductive RF excitation source;

FIG. 1D depicts a plasma processing system with three RF excitation sources;

FIG. 1E depicts a plasma processing system with three RF excitation sources including an inductive RF excitation source;

FIG. 6A illustrates replacement of RF excitation sources for creating bias voltages in the plasma sheath by a bias supply;

FIG. 6B is a graph depicting a single energy peak that may be produced using the bias supply of FIG. 6A;

FIG. 6C is a graph depicting dual energy peak that may be produced using the bias supply of FIG. 6A;

FIG. 8B is a graph depicting another periodic voltage waveform that may be applied to a substrate support to achieve the sheath voltage depicted in FIG. 8A;

DETAILED DESCRIPTION

Figure 2:
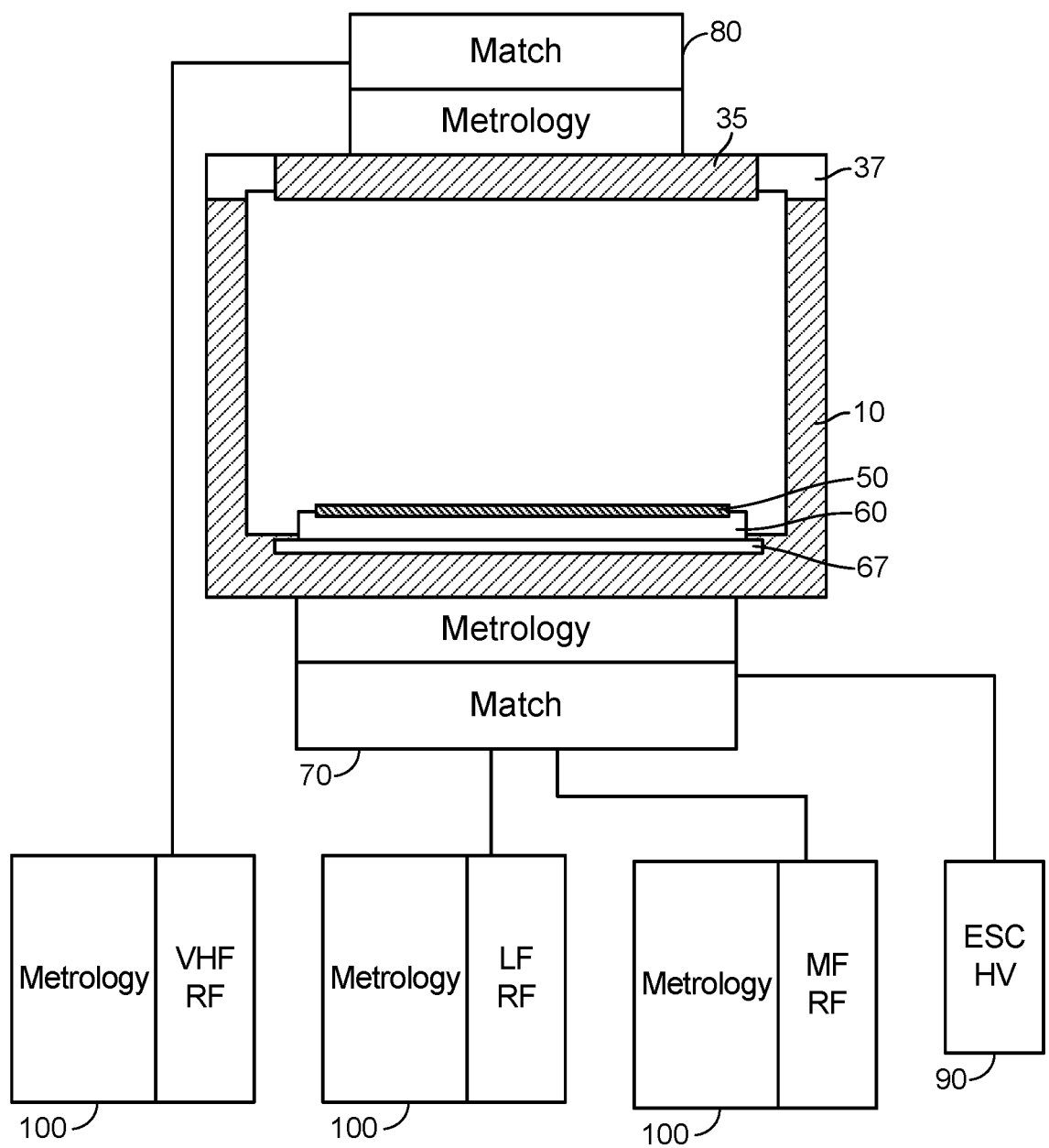
FIG. 2 depicts an implementation of the plasma processing systems shown in FIGS. 1D and 1E.

The word "exemplary" is used herein to mean "serving as an example, instance, or illustration." Any embodiment described herein as "exemplary" is not necessarily to be construed as preferred or advantageous over other embodiments.

Preliminary note: the flowcharts and block diagrams in the following Figures illustrate the architecture, functionality, and operation of possible implementations of systems, methods and computer program products according to various embodiments of the present invention. In this regard, some blocks in these flowcharts or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

While the following disclosure generally refers to wafer plasma processing, implementations can include any substrate processing within a plasma chamber. In some instances objects other than a substrate can be processed using the systems, methods, and apparatus herein disclosed. In other words, this disclose applies to plasma processing of any object within a sub-atmospheric plasma processing chamber to effect a surface change, subsurface change, deposition or removal by physical or chemical means.

This disclosure may utilize plasma processing and substrate biasing techniques as disclosed in the following bias-supply-related patents: U.S. Pat. Nos. 9,287,092, 9,287,086, 9,435,029, 9,309,594, 9,767,988, 9,362,089, 9,105,447, 9,685,297, 9,210,790. The entirety of these patents are incorporated herein by reference.

For the purposes of this disclosure, "excitation sources," "source generators," "RF generators," and "RF sources" are those whose energy is primarily directed to generating and sustaining the plasma, while "bias supplies" are those whose energy is primarily directed to generating a surface potential for attracting ions and electrons from the plasma.

FIGS. 1A-1E illustrate various versions of excitation and sinusoidal bias combinations for Radio Frequency (RF) excitation of a plasma in a plasma processing chamber. Different RF excitation frequency ranges are listed as LF (Low Frequency <3 MHz), MF (Medium Frequency >3 MHz-<30 Mhz) and VHF (Very High Frequency >30 MHz). While exemplary frequency ranges are indicated in FIGS. 1A-1E, one of skill in the art will appreciate that other frequency ranges and combinations of frequency ranges may also be implemented.

FIG. 1A illustrates a system wherein a single high frequency RF excitation source 20 (e.g., an RF generator or an RF generator and match), is connected to an electrode 25 upon which a substrate (e.g., a wafer) sits and is processed. The remainder of the chamber body 10 is at ground potential. The presence of a capacitor between the RF exciting source 20 and the plasma 15, either a discrete component or formed by the construction of the electrode 25, causes a DC voltage bias in a plasma sheath above the wafer to be formed. As used herein, the sheath voltage means a potential difference between a surface of a substrate (also referred to herein as a workpiece) and the plasma 15 in a processing chamber.

FIG. 1B is similar to FIG. 1A, but with the addition of a second RF excitation source, which may be a higher frequency than the source 20 of FIG. 1A. For instance, this second RF excitation source can be a VHF source. The second source may be connected to a second electrode 35 that may be opposite the first electrode 25. Both the first and second sources contribute to the sheath voltage, and hence, ion energy reaching the substrate, though the second source is primarily directed to formation and maintenance of the plasma. This two-source system, in some (but not all) instances, can attain higher plasma ion densities than single source system of FIG. 1A. Higher plasma ion density leads to faster processing, which reduces costs in the fabrication industry.

FIG. 1C illustrates an alternative to the design depicted in FIG. 1B where the second source (a capacitive source) is replaced with an inductive source. For instance, the second source can include a conductive coil 40 driven by an RF source. This inductive source may be driven at lower frequencies than the capacitive source of FIG. 1B. For instance, high frequency driving voltage may be used. This source inductively couples energy into the plasma to generate and maintain the plasma. Again, both sources contribute to the sheath voltage, and hence, ion energy, though the inductive source is primarily directed to generating and maintaining the plasma.

FIGS. 1D and 1E illustrate plasma processing chambers using three RF excitation sources. As shown, one source may be coupled to the plasma via a first electrode shown at a top of the chambers (though other positions are also possible), while the other two RF excitation sources are connected to the substrate supporting electrode. This combination of sources allows additional flexibility in controlling the substrate bias profile. For instance, one of the sources coupled to the substrate electrode could provide a pulsed voltage waveform, while the other provides a DC current.

FIG. 2 shows one implementation of the plasma processing chamber shown in FIGS. 1D and 1E that includes three RF excitation sources. As shown, each of the sources can include metrology assemblies 100. The source and metrology 100 can each be connected to electrode assemblies 35 and 60 via match and metrology assemblies 80 and 70 respectively. The electrodes 35 and 60 can be isolated from the chamber body 10 by insulators 37 and 67. A workpiece 50 sits on the lower electrode assembly 60. A high voltage power supply 90 is connected to the lower electrode assembly 60 to provide electrostatic chucking of the workpiece 50, for instance, when helium back side cooling is utilized. It is apparent that this is a more complex and costly arrangement compared to earlier generations of plasma processing chambers. This escalating cost and complexity is a significant problem for purchasers of such plasma processing equipment.

Figure 3:
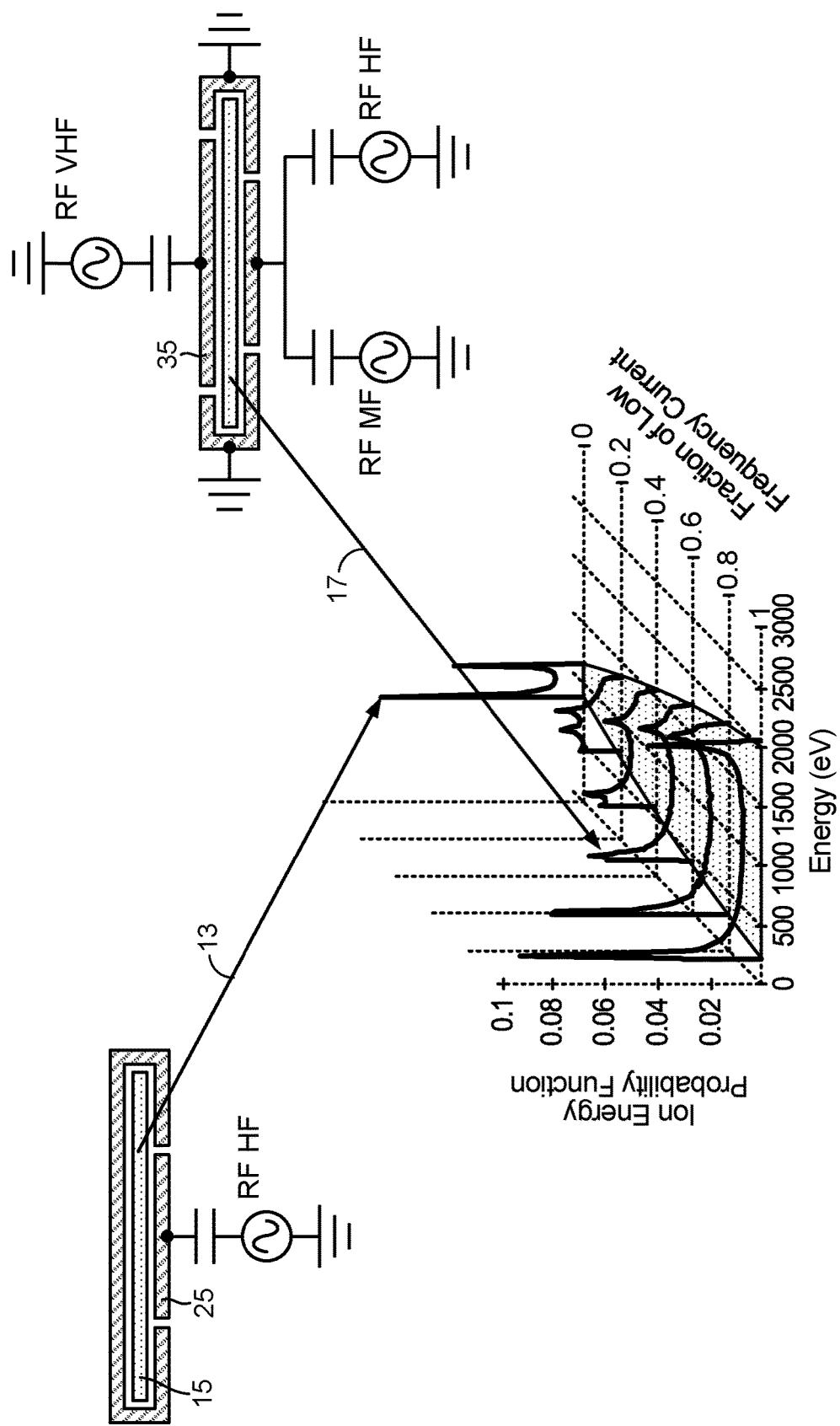
FIG. 3 depicts ion energy distributions associated with plasma processing systems depicted in FIGS. 1A through 1E.

FIG. 3 illustrates the impact of using a second RF excitation source for biasing the substrate and thereby controlling a substrate bias voltage. The plasma processing arrangements in FIGS. 1A-1C produce a twin peak distribution 13 of the ion energy as indicated by the arrow 13. When a second RF excitation source is added for biasing the substrate, the ion energy distribution function (IEDF) is modified as shown by arrow 17. Adjusting the ratio of current for the two RF generators biasing the substrate can modify the IEDF function but two peaks persist.

While the existence of two peaks can be problematic, in other use cases, two ion energy peaks can be beneficial. For instance, during the etching of deep holes such as contacts in semiconductor wafer fabrication, anisotropic etch results are required where the hole depth deepens without a corresponding growth in the cross-section area of the hole (e.g., there may be a desire to maximize a rate of etching a bottom of the hole relative to a rate of sidewall etching). This can be achieved by utilizing a plasma etch chemistry that deposits a polymer on the side walls of the hole, thus protecting the side wall from etching, while vertical etching continues to deepen the hole (e.g., with oxidizing components of the plasma chemistry).

In FIG. 3, the higher energy of the two peaks corresponds to ions that principally aid etching of material in the vertical direction, while the lower of the two peaks corresponds to ions that principally aid side wall polymer deposition. The balancing of the etching and polymerizing components of the plasma chemistry is a complex task that can involve optimization of RF excitation sources' powers and frequencies, quantity and ratio of gases fed into plasma, operating pressure, wafer temperature, choice of patterning such as resist type and associated hard masks, and other factors. Thus, there is a need in the art for improved methods of controlling the ion energy of the peaks in FIG. 3, as well as the amplitude of these peaks relative to each other.

In recent years, advanced plasma processing systems have resorted to using pulsed plasmas for several reasons. In one instance, to reduce the average energy imparted to a wafer. For example, to achieve a desired etch rate or depth of an etched feature, high powers, such as ten or more kilowatts of bias power, may be used. Unfortunately, continuous application of such high power might damage the wafer or process hardware, so pulsing is used to reduce average power delivered by reducing the duty cycle. In another instance, pulsing is used to control the electron temperature in the plasma.

Figure 4:
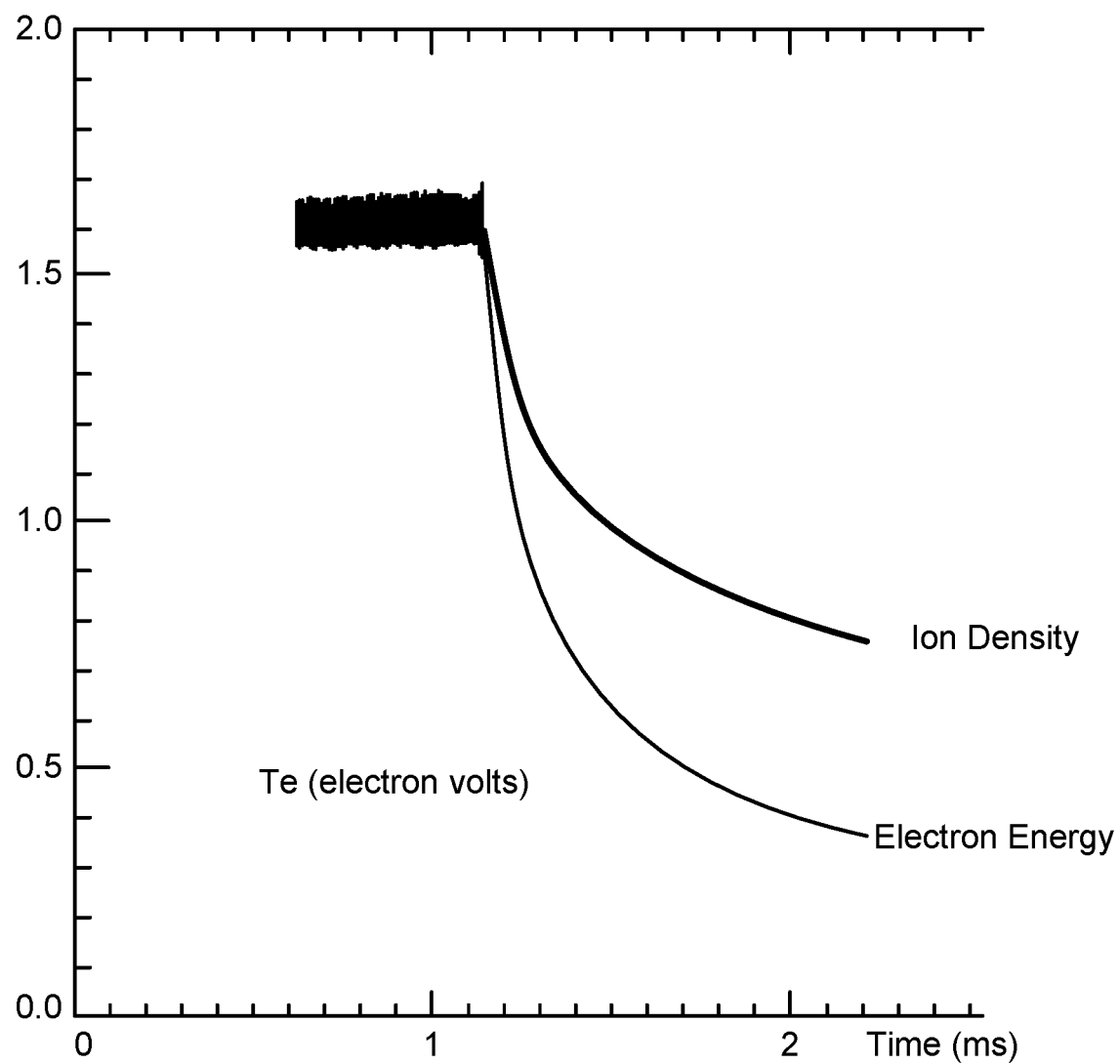
FIG. 4 is a graph depicting ion density and electron density before and after RF excitation is removed from a plasma processing chamber.

FIG. 4 shows an example of the effect, where after the plasma is turned off, the electron energy/temperature in the plasma decays much faster than the rate of ion decay. By pulsing the plasma, the electron temperature can be reduced while maintaining a reasonable density of ions. The temperature of the electrons in a plasma determines the level of chemical dissociation within the plasma; thus, pulsing can be used to change the chemical species composition within the plasma.

Figure 5A:
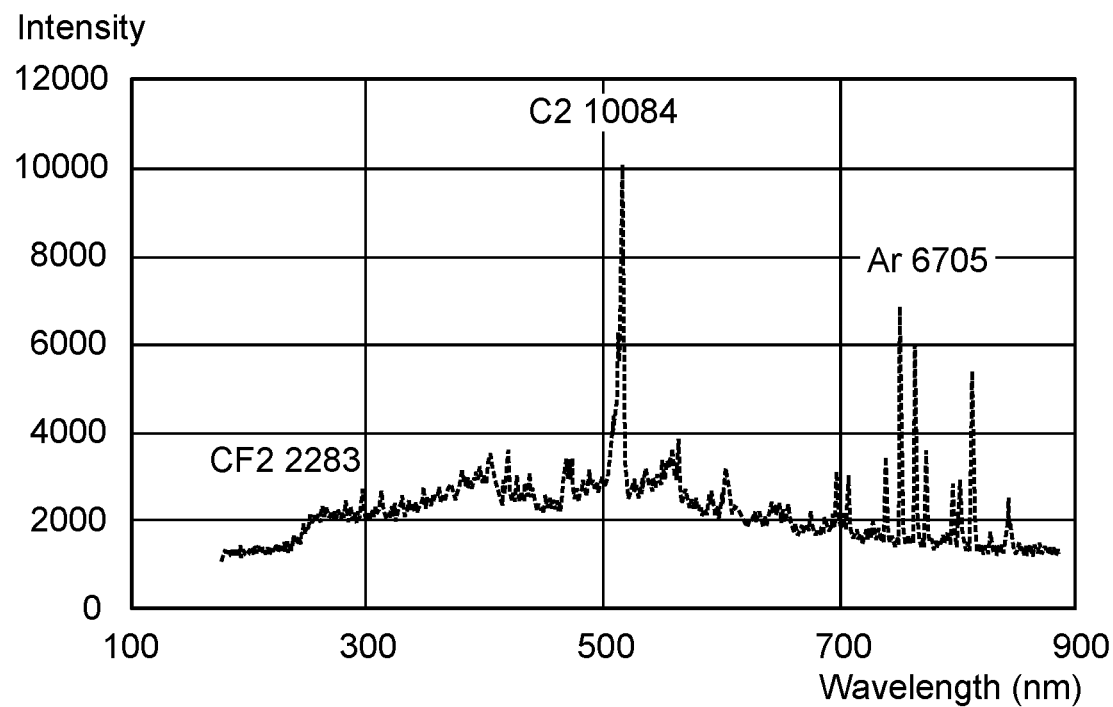
FIG. 5A is a graph depicting optical emission spectra of a plasma and illustrates a case where an induction source such as shown in FIG. 1C or 1E is used with a carbon-fluoride such as C2F6 or C4F6, argon and oxygen.

FIG. 5A shows optical emission spectra of a plasma and illustrate a case where an induction source such as shown in FIG. 1C or 1E is used with a carbon-fluoride such as $C2F6$ or $C4F6$, argon and oxygen and powered sufficiently to create a high degree of dissociation and liberate an excess of fluorine ions thus causing a C2 peak at just over 500 nm wavelength. This plasma chemistry will have a high etch rate but a poor anisotropic etch profile due to a non-ideal balance of etching chemistry to polymerization chemistry.

Figure 5B:
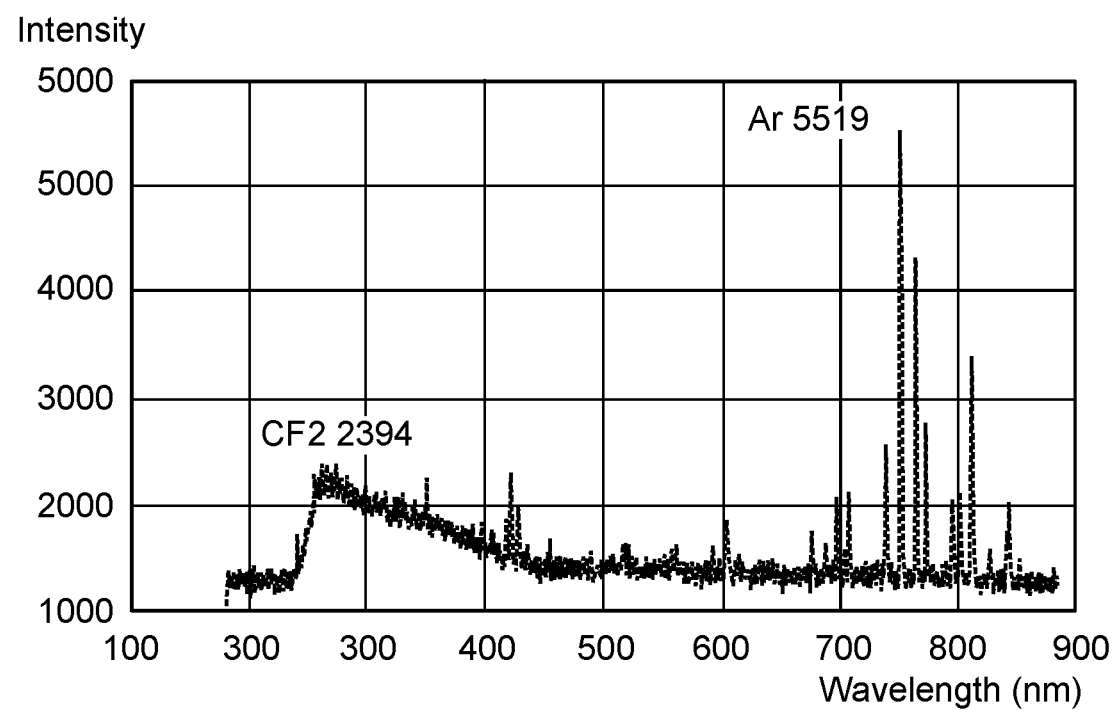
FIG. 5B is a graph depicting optical emission spectra of a plasma where the induction source such as shown in FIG. 1C or 1E is pulsed with a carbon-fluoride such as C2F6 or C4F6, argon and oxygen.

FIG. 5B shows the situation where the same chemistry and RF power conditions are used as in FIG. 5A, but the RF power is pulsed, in this case at approximately 1 kHz and a 50% duty cycle. This profile shows no C2 peak and a greater amount of bound fluorine below 400 nm wavelength which is characteristic of a balanced plasma chemistry for anisotropic etching.

Many bias supplies operate with a symmetrical (e.g., sinusoidal) output (e.g., where a first half-cycle of the waveform has a corresponding symmetrical component in a last half-cycle of the waveform). Applying a sinusoidal waveform to a substrate induces a broad distribution of ion energies, which limits the ability of the plasma process to carry out a desired etch profile.

FIG. 6A illustrates replacement of RF sources (e.g., that apply a symmetrical waveform) for creating bias voltages in the plasma sheath by a "bias supply" 200. The bias supply 200 may be realized by, and operated consistent with, the bias supplies disclosed in the bias-supply-related patents listed previously herein. In addition, the present disclosure includes details exemplary bias supplies further herein with reference to FIGS. 19-24.

In FIG. 6B, the bias supply 200 is used to achieve a single energy peak while FIG. 6C illustrates that the bias supply 200 can be programmed to also produce a dual energy peak result. The actual shape of the ion energy distribution function is tunable. This is very advantageous and greatly simplifies the development of plasma process recipes for achieving desired process results. At the same time, the bias supply bias voltage profile can be controlled to ensure that an electrostatic voltage required for holding the wafer in place is maintained. In other words, the bias supply 200 can control sheath voltage and ion density, control pulsing of the bias voltage, and also maintain electrostatic chucking of the wafer.

Figure 7A:
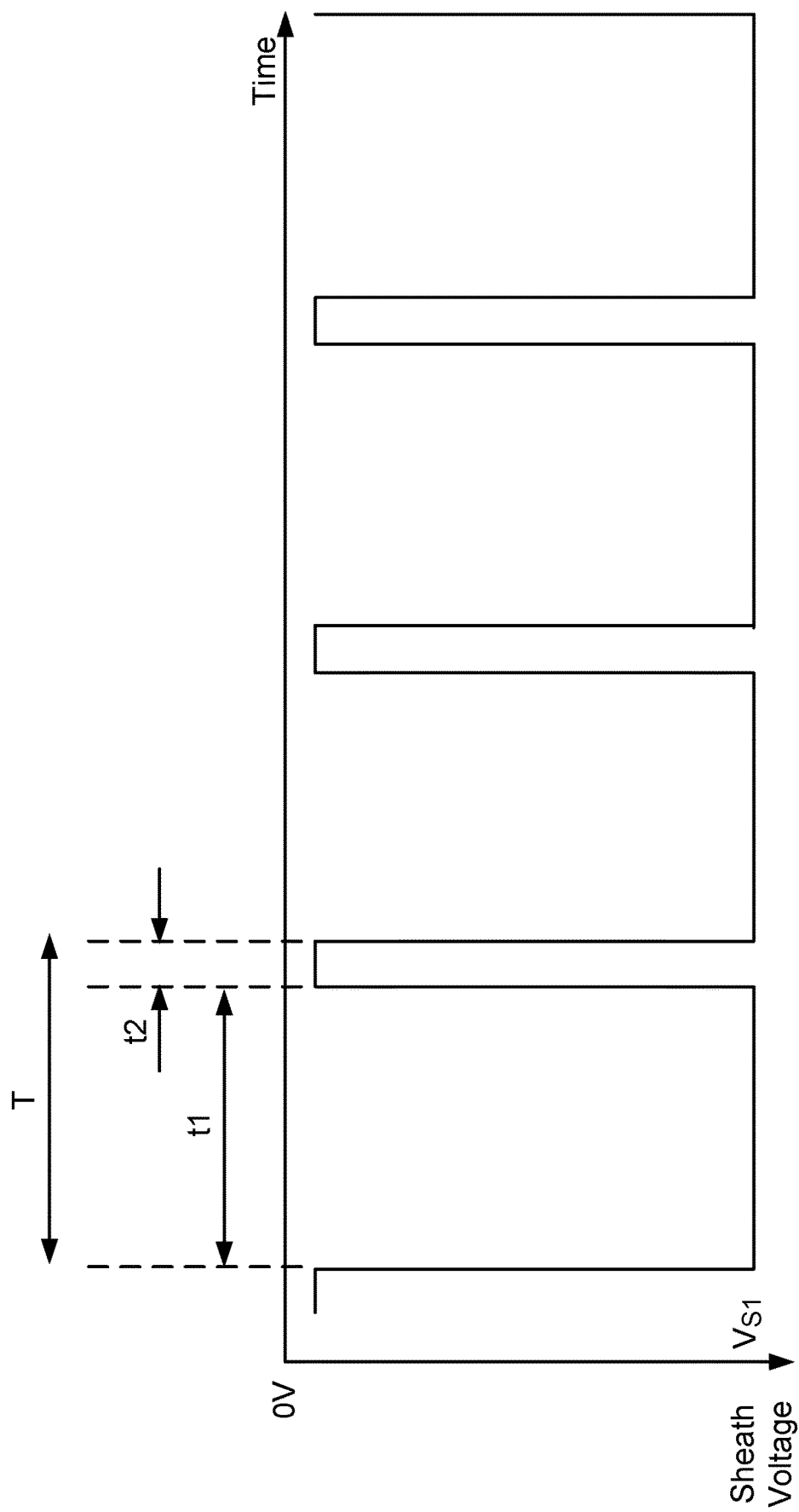
FIG. 7A is a graph depicting an exemplary sheath voltage over time.
Figure 7B:
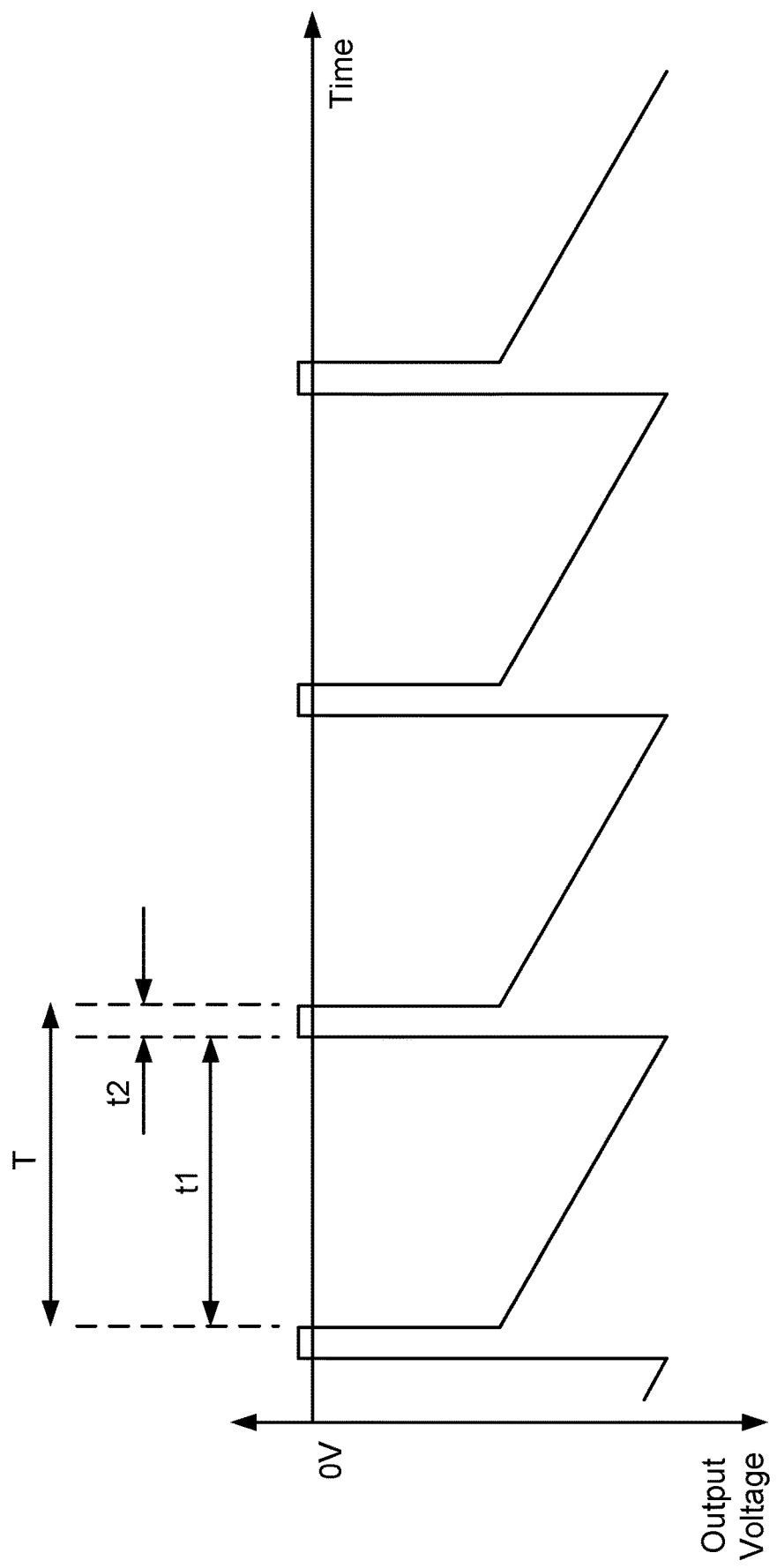
FIG. 7B is a graph depicting a periodic voltage waveform that may be applied to a substrate support to achieve the sheath voltage depicted in FIG. 7A.

Referring next to FIGS. 7A and 7B shown, respectively, are depictions of an exemplary sheath voltage and a periodic voltage waveform to achieve the sheath voltage. More specifically, FIG. 7A is a general depiction of a sheath voltage that may be generated to produce an ion energy distribution similar to the distribution depicted in FIG. 6B. As those of ordinary skill in the art appreciate, an electrode coupled to the bias supply 200 may be capacitively coupled to the plasma, and a non-linear nature of the plasma sheath results in a potential difference between the surface of the workpiece and the plasma. This voltage drop across the plasma sheath determines the average energy of the plasma ions that are accelerated towards the substrate, and as a consequence, the sheath voltage affects etching performed by the ions.

As shown in FIG. 7A, apart from a periodic rise (depicted, e.g., during time t2) in the sheath voltage, the sheath voltage is substantially constant (depicted, e.g., during time t1) to produce a substantially monoenergetic distribution of ion energy. During each periodic rise in sheath voltage, the substrate potential reaches the plasma potential and the sheath briefly collapses, but t1 may be between 65% and 95% of the cycle (t1+t2), and in an exemplary implementation, t1 is 80% of the cycle. And the sheath voltage may vary with a frequency of 400 kHz; thus, t1+t2 (depicted as period T) may be 2.5 microseconds (but it is certainly contemplated that the sheath voltage may vary at different frequencies). The substantially constant sheath voltage during t1 determines the ion energy distribution function.

Those of ordinary skill in the art also appreciate that the periodic rise in sheath voltage depicted in FIG. 7A is intentional due to the fact that a non-varying DC voltage cannot simply be applied to a substrate support because the ion current that impinges upon a surface of the workpiece increases an amount of positive charge on the surface of the substrate.

As a consequence, as shown in FIG. 7B, a periodic voltage waveform is applied to the substrate electrode that results in the applied voltage being divided between the chuck, substrate, and sheath capacitances. This approach enables compensation for the ion current, allowing the sheath voltage and the substrate voltage to remain constant during a high percentage (e.g., between 75% and 90%) of each bias voltage cycle. As shown, the periodic voltage waveform is asymmetric, so that a first half-cycle of the voltage waveform does not have a corresponding symmetrical component during a last half-cycle of the voltage waveform. As shown, the periodic voltage waveform includes a positive jump (during the time t2) to remove the extra charge accumulated on the substrate; a negative voltage swing (at the end of t2) to establish the sheath voltage; and a negative voltage ramp to compensate for ion current (to keep the sheath voltage constant during the time t1). Although not required, the periodic voltage waveform may be 400 kHz, and if so, t1 may be between 1.9 and 2.25 micro seconds and t2 may be between 0.6 and 0.25 micro seconds, respectively.

Figure 8A:
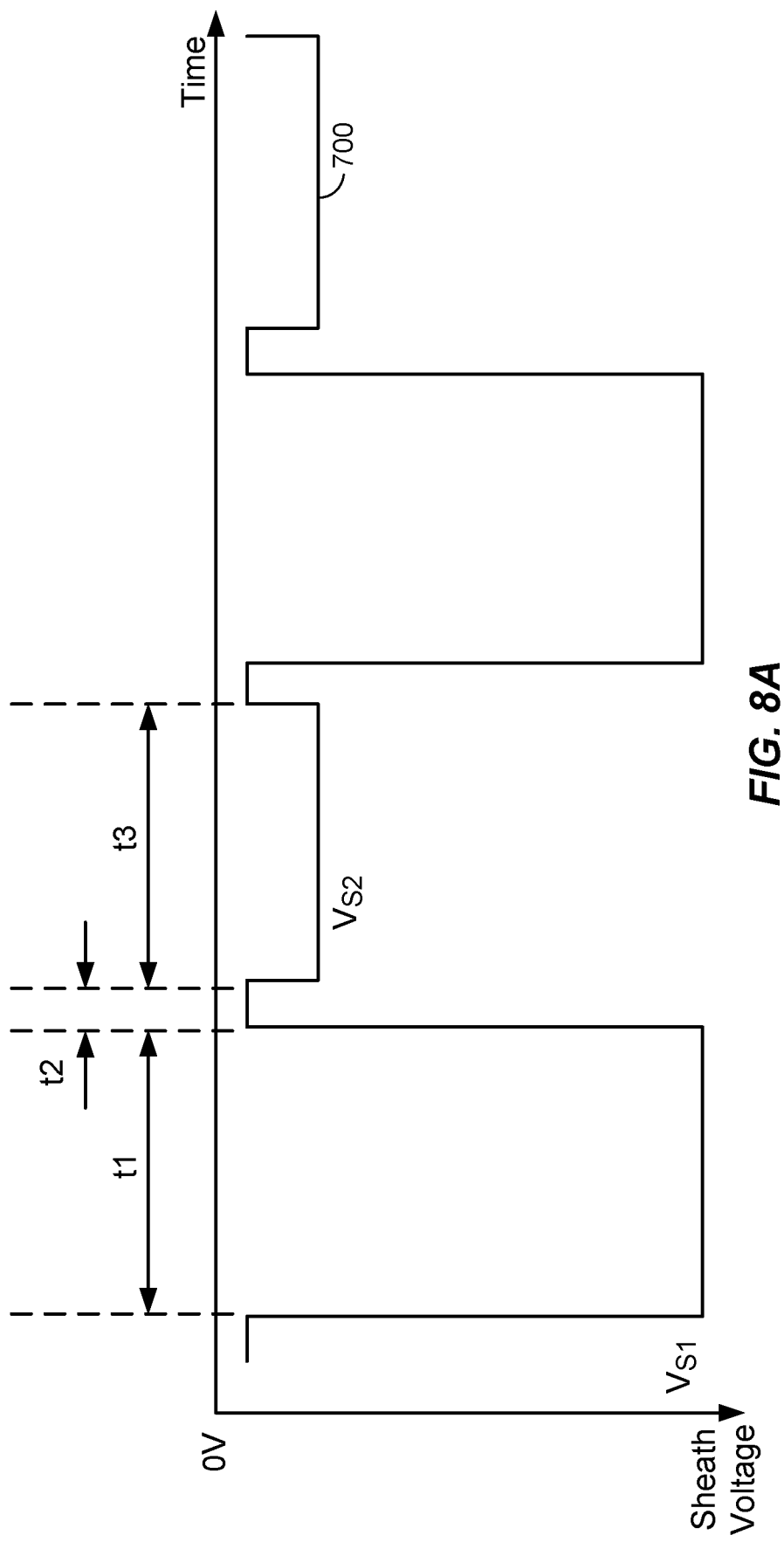
FIG. 8A is a graph depicting another exemplary sheath voltage over time.

Referring next to FIGS. 8A and 8B, shown are an exemplary (varying) sheath voltage and corresponding asymmetric periodic voltage waveform to achieve the varying sheath voltage. The sheath voltage depicted in FIG. 8A may be used to produce an ion energy distribution function similar to that depicted in FIG. 6C. More specifically, the sheath voltage depicted in FIG. 8A alternates between a higher voltage (VS1) and a lower sheath voltage (VS2), which results in a two-peak ion energy distribution function. Although FIG. 8A depicts one high sheath voltage for every low sheath voltage (a 1:1 ratio), to achieve the lower probability of the lower energy shown in FIG. 6C, the number of high energy sheath voltage pulses at VS1 may be increased relative to the number of lower voltage pulses at VS2.

Figure 9A:
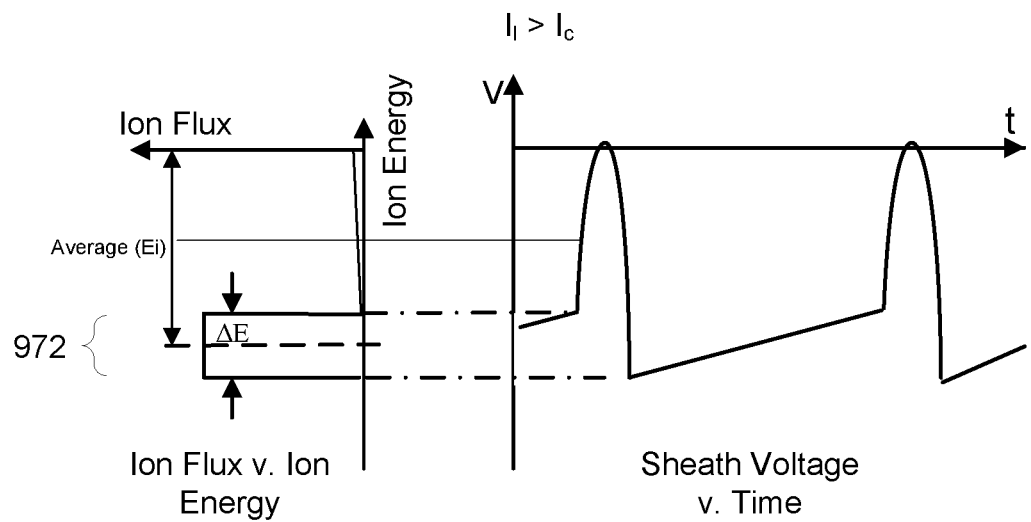
FIG. 9A depicts yet another sheath voltage and a resulting ion flux versus ion energy.
Figure 9B:
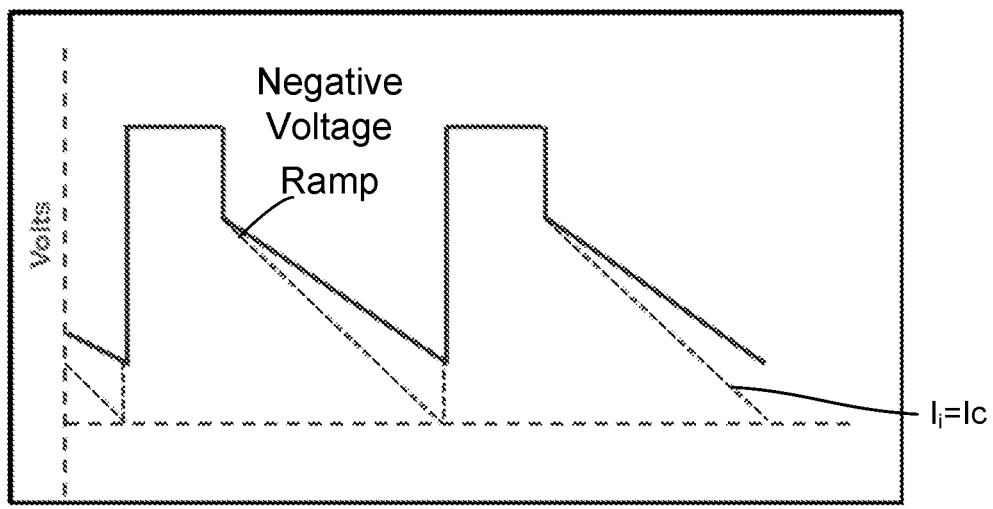
FIG. 9B is a graph a periodic voltage waveform that may produce the sheath voltage depicted in FIG. 9A.

Referring to FIGS. 9A and 9B, shown are aspects of sheath voltage, ion flux, and a periodic asymmetric voltage waveform (output by a bias supply) associated with under-compensated ion current. As shown in FIG. 9A, when ion current is under compensated, a sheath voltage becomes less negative in a ramp-like manner, which produces a broader spread 972 of ion energies. Shown in FIG. 9B is a periodic voltage that may be applied to a substrate support to effectuate the sheath voltage depicted in FIG. 9A. As shown, the negative ramp-like portion of the periodic voltage waveform drops with a lower slope than the ramp-like portion of a period voltage waveform (shown as a broken line) that compensates for ion current so that ion current is equal to the compensation current provided to the substrate support.

Figure 10A:
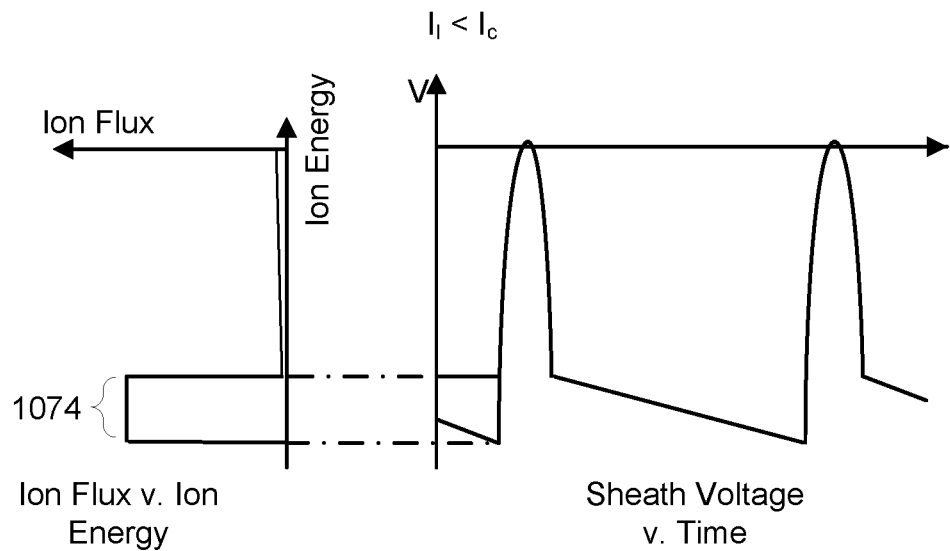
FIG. 10A depicts yet another sheath voltage and a resulting ion flux versus ion energy.
Figure 10B:
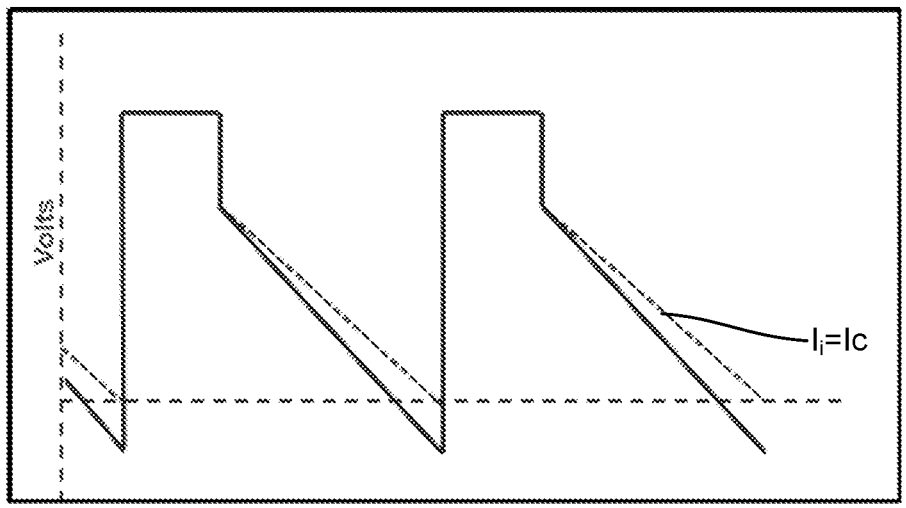
FIG. 10B is a graph a periodic voltage wave form that may produce the sheath voltage depicted in FIG. 10A.

FIGS. 10A and 10B depict aspects of sheath voltage, ion flux, and a periodic asymmetric voltage waveform (output by a bias supply) associated with over-compensated ion current. As shown in FIG. 10A, when ion current is over compensated, a sheath voltage becomes more negative in a ramp-like manner, which also produces a broader spread 1074 of ion energies. Shown in FIG. 10B, is a periodic voltage waveform that may be applied to a substrate support to effectuate the sheath voltage depicted in FIG. 10A. As shown, the negative ramp-like portion of the periodic voltage function drops at a greater rate than the ramp-like portion of a period voltage waveform that compensates for ion current (shown as a dotted line).

Figure 11:
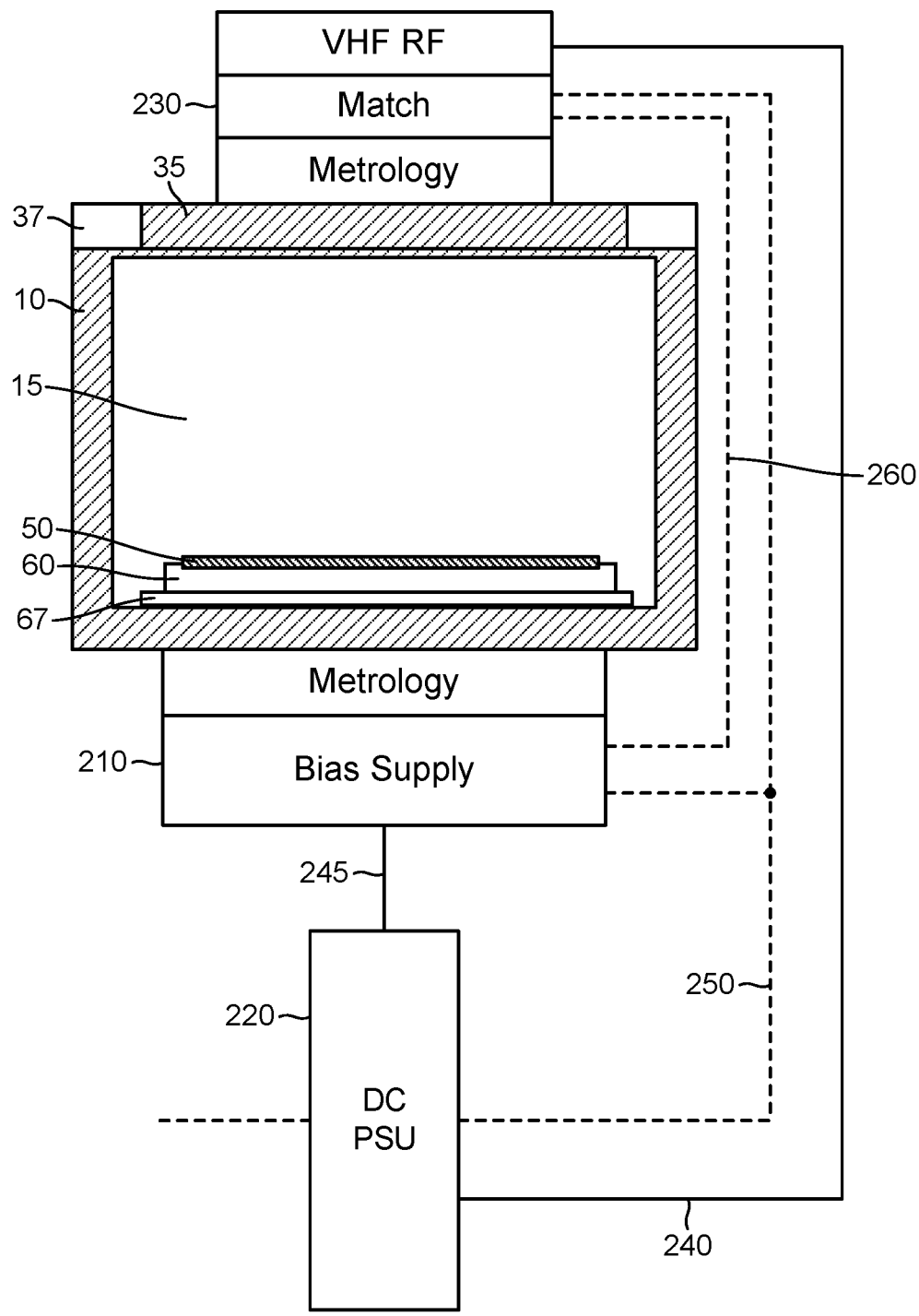
FIG. 11 is a diagram depicting aspects of an exemplary plasma processing system.

Referring to FIG. 11, shown is a plasma processing system, which significantly simplifies plasma processing compared to previous practice. The plasma chamber 10 is shown with a plasma 15 which is created by an RF excitation (e.g., VHF) while a bias applied to the workpiece 50 is provided by a bias supply 210, which may or may not include a metrology assembly. In this embodiment, a single DC power supply unit 220, which can be located some distance from the process chamber 10, can be connected to the bias supply 210 and an RF excitation source 230 (which may or may not include include a VHF RF/metrology/match assembly) by cables 245 and 240, respectively. Power control and data signals may be delivered and received by a communication cable 250. Very high-speed synchronization between the electrical excitation and bias voltages is provided by cable 260. The capacitance coupled VHF RF excitation source illustrated can be substituted with an inductive source as shown in FIG. 1E with the RF excitation sources replaced by the bias supply 210. Alternatively, a microwave slit or similar plasma excitation source can be used, as well as various other excitation sources. Although "RF" excitation is referred to herein in numerous examples, it should be recognized that relatively low frequencies may be utilized in some embodiments to excite and maintain a plasma.

Figure 12:
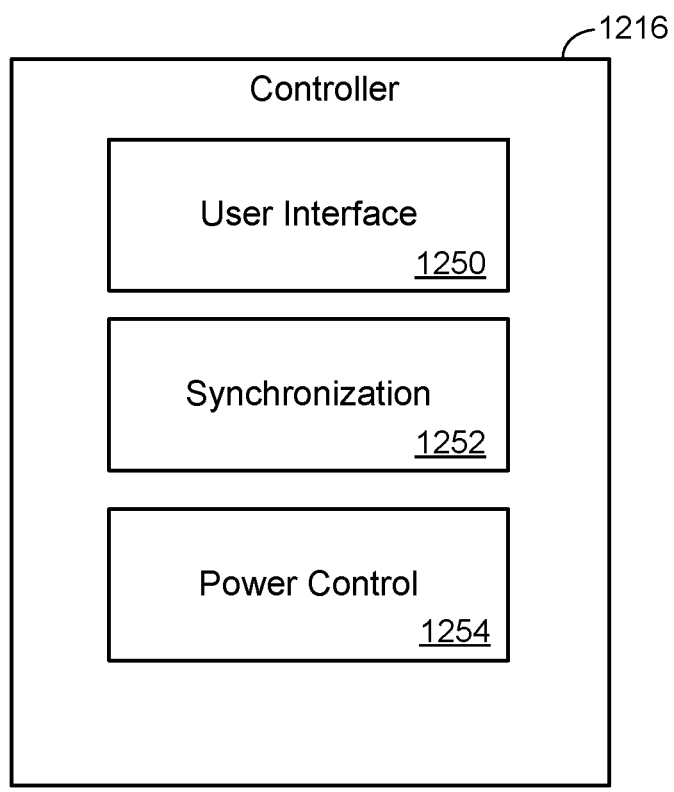
FIG. 12 is a block diagram depicting aspects of a controller that may be used in connection with the plasma processing system depicted in FIG. 11.

FIG. 12 is a block diagram depicting functional components of an exemplary controller 1216. As shown, the controller 1216 may include a user interface component 1250, a synchronization module 1252, and a power control module 1254. The depicted components of the controller 1216 may be centrally located and implemented in a tool controller that is disposed and configured to control both the bias supply 210 and the excitation source. Alternatively, the components of the controller 1216 may be duplicated and implemented in each of the bias supply 210 and an excitation source. Moreover, the components of the controller 1216 may be distributed so that one of more of the components (e.g., the user interface 1250 and power control module 1254) are centrally located in a tool controller and one or more of the components are implemented in close connection with the bias supply 210 and the excitation source.

Figure 13:
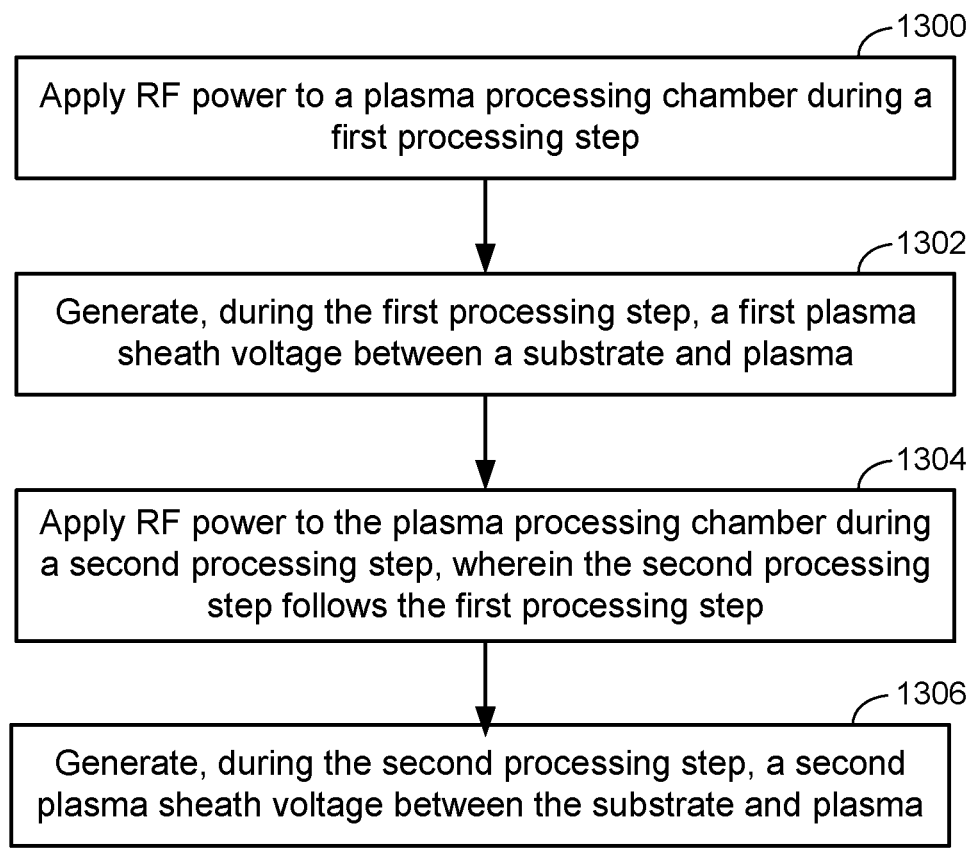
FIG. 13 is a flowchart depicting a method that may be traversed in connection with embodiments disclosed herein.

FIG. 13 is a flowchart depicting a method that may be traversed in connection with embodiments disclosed herein. As shown, the RF excitation source 230 is used to apply power to the processing chamber 10 during a first processing step (Block 1300), and the bias supply 210 is used to apply an asymmetric periodic voltage waveform to a substrate support to produce a desired sheath voltage between the substrate 50 and plasma 15 during the first processing step (Block 1302). Thus, the application of power to the RF excitation source 230 and the bias supply 210 is synchronized. In addition, the RF excitation source 230 and the bias supply 210 are synchronized during a second processing step that follows the first processing step. More specifically, excitation power (e.g., RF power) is applied to the processing chamber 10 during the second processing step 1304 (Block 1304), and a different asymmetric periodic voltage waveform is applied (by the bias supply 210) to the substrate support to produce second plasma sheath voltage between the substrate and plasma during the second processing step (Block 1306). It should be recognized that the two steps depicted in FIG. 13 are merely exemplary of any two of a series of multiple processing steps that may be synchronized.

Referring next to FIGS. 14-17, shown are exemplary source voltages (that may be applied by the RF excitation source 230 and exemplary sheath voltages (also referred to as bias voltages) that that may be produced by the bias supply 210. More specifically, shown in each of FIGS. 14-17 are excitation-source voltages and sheath voltages that may be produced during a first processing step and a second processing step. It should be recognized that the depicted combinations of excitation-source and sheath voltages in FIGS. 14-17 are exemplary only and that any one of the depicted source voltages in FIGS. 14-17 may be applied during any one or more of the first step or second step in synchronization with any one of the sheath voltages depicted in FIGS. 14-17. It should also be recognized that the two processing steps generally depict two or more processing steps that may repeat over time with a fixed or varying duty cycle. As opposed to prior approaches that apply an symmetrical voltages (e.g., sinusoidal) voltages to a substrate to modify ion energy (which results in an uncontrolled, time varying, sheath voltage) the application of the periodic asymmetric voltage function (output, for example, from the bias supply 210 as shown in FIGS. 7B, 8B, 9B, and 10B) enables a constant sheath voltage and/or a non-constant sheath voltage that varies in a predetermined, desired manner.

It should be recognized the periodic voltage waveform that is output by the bias supply during first step, second step, or during both the first step and second step may be modified over time to obtain a desired sheath voltage, and hence, a desired distribution of ion energies. For example, during one or both of the processing steps, the relative number of sheath voltage pulses at a specific amplitude will determine a relative ion fraction at an ion energy corresponding to a specific amplitude. This is described above with reference to reference to FIGS. 8A and 6C where there is a 1:1 ratio of different amplitude sheath voltage pulses resulting in two ion energy peaks. Moreover, the wafer voltage (also referred to as the sheath voltage) can be modulated at different amplitudes to create an ion energy distribution function having more than one energy peak with different amplitudes as described with reference to FIGS. 9A to 9C of U.S. Pat. No. 9,287,086 (which details a process of applying a higher number of sheath pulses at a higher amplitude relative to a number of lower amplitude sheath pulses to produce a desired ion fraction at two energy peaks). U.S. Pat. No. 9,287,086 is incorporated herein by reference.

As another example (described further herein with reference to FIGS. 14-17), the negative voltage ramp of the periodic voltage function (output by the bias supply 210) may be modified (as described with reference to FIGS. 9A through 10B) between (and/or within) each of the first and second processing steps to under-compensate, compensate, or over-compensate for ion current that impinges upon the surface of the substrate. As depicted in FIGS. 9A and 10A, if the bias supply either under compensates or over compensates for ion current, the sheath voltage will have a range of values that result in a relatively broad distribution of ion energy values. In FIGS. 14-17, the range of potential sheath voltages is depicted as sheath voltage ranges 1420 and 1422, respectively, in the first step and second step. Imparting a range of sheath voltages is not required, but it is desirable in some processing steps to have ions impinge upon the substrate with a range of ion energies that are disposed about a main ion energy; thus, in some implementations, ion current is over (or under) compensated as shown in FIGS. 9A and 10A. Another approach to achieving multiple sheath voltages (as shown within the ranges 1420 and 1422) is to modulate the negative voltage swing of the periodic voltage waveform that is applied to the substrate support as is shown, for example, in FIG. 8B. Moreover, the flux of the ions at any ion energy may be modified by pulsing the RF excitation source to reduce the density of the plasma, and hence, the ion flux.

Figure 14:
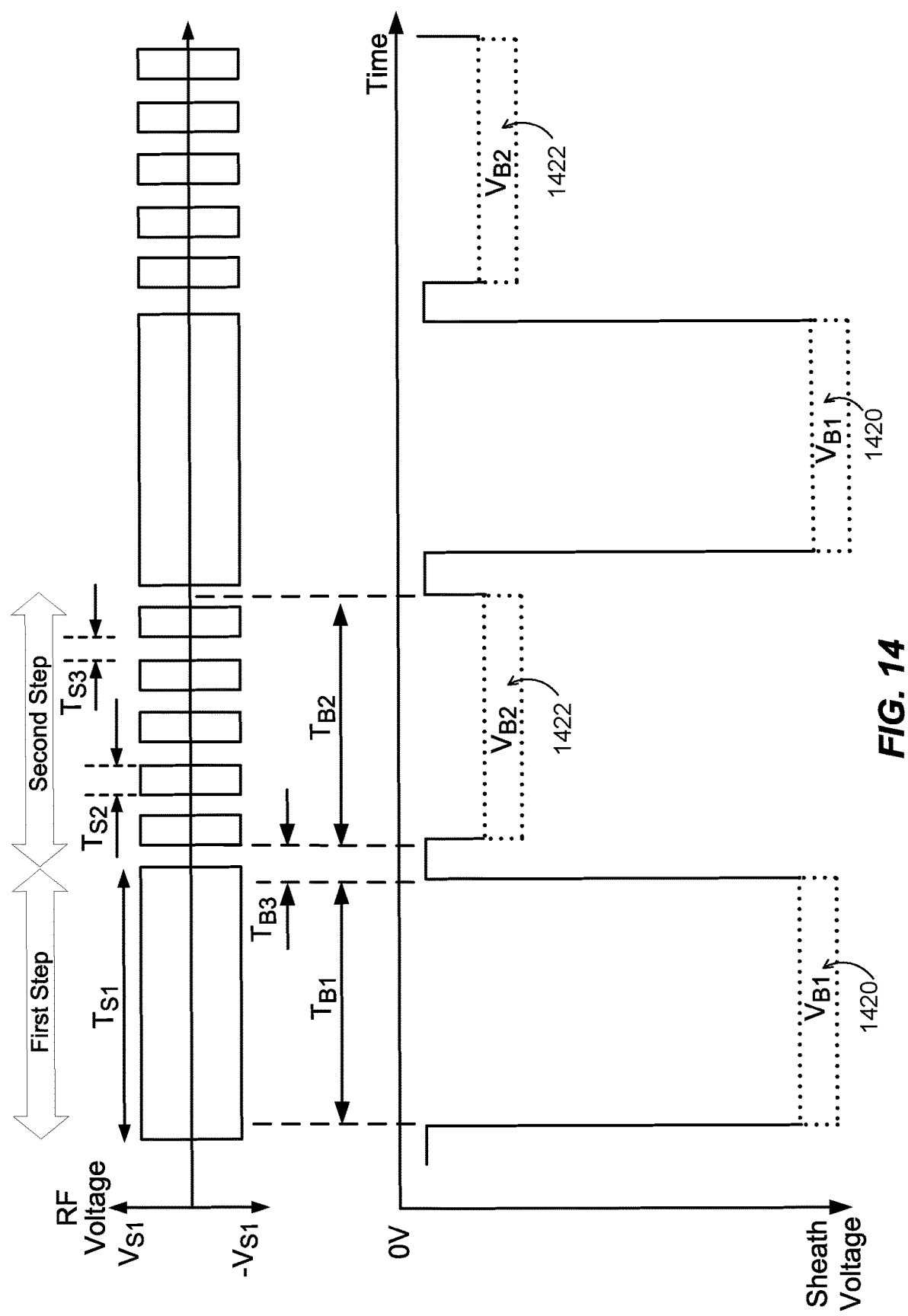
FIG. 14 depicts exemplary RF voltage and exemplary sheath voltage.

Referring FIG. 14, shown are timing charts of a source voltage (shown at the top of FIG. 14) that may be applied by the RF excitation source 230 and a sheath voltage (shown at the bottom of FIG. 14) that may be effectuated by the bias supply 210 where pulsing of the RF excitation source 230 is used along with changes to the peak-to-peak sheath voltage.

It should be recognized that the time scale in FIGS. 14 (and FIGS. 15-17) is different than the time scale of FIGS. 7A-8B. For example, the sheath voltages of FIGS. 7A and 8A (and the corresponding voltages of FIGS. 7B and 8B output from the bias supply) may repeat with a cycle time of 2.5 microseconds. And in contrast, the first and second steps (and $T_{S1}$, $T_{B1}$, and $T_{B2}$) may be 0.1 or more milliseconds (e.g., between 0.1 and 20 milliseconds); thus, the sheath voltage in FIG. 14 may cycle 400 or more times (e.g., between 250 and 8,000 times) during each of the first step and second step (and during $T_{S1}$, $T_{B1}$, and $T_{B2}$). But for clarity, the detail of the varying sheath waveform (shown in FIGS. 7A and 8A) is not shown in the sheath voltage of FIGS. 14-17. Instead, the sheath voltages ($V_{B1}$ and $V_{B2}$) are depicted in FIGS. 14-17 as the sheath voltage exists between 65% and 95% of the time (e.g., 80% of the time)—without the periodic rise (depicted during time t2 in FIGS. 7A and 8A) in the sheath voltage.

In the example mode of operation depicted in FIG. 14, the sheath voltage profile is shown stepping between two peak voltage amplitudes, $V_{B1}$, for a period $T_{B1}$, and $V_{B2}$, for a period $T_{B2}$ with a small intervening time $T_{B3}$. The drop in the magnitude of the sheath voltage during the depicted intervening time $T_{B3}$ is an optional drop that may be carried out during a transition between the first and second processing steps. For example, if a gas (that is provided to the plasma processing chamber 10) between processing steps 1 and 2 is changed, it may be desirable to reduce or remove power that is applied by the bias supply, but this is not required and the depicted time $T_{B3}$ may be zero seconds in length so that the sheath voltage changes directly from $V_{B1}$ to $V_{B2}$. It should be recognized that the time of the first step and second step are depicted to be about the same, but this is certainly not required, and in some instances, it is beneficial to have one processing step that is substantially shorter than the other processing step.

As shown in the example depicted in FIG. 14, the source voltage is pulsed synchronously with the $V_{B2}$ cycles during the second step and is continuous during the $V_{B1}$ cycles of the first step. During the $V_{B2}$ cycles, the plasma chemistry will be ionized to the level determined by operating conditions of the plasma chamber 10 with corresponding plasma chemistry including of ions, radicals and neutral atoms or molecules. The $V_{B2}$ cycles see a lower sheath voltage (between the substrate and plasma) than during the $V_{B1}$ cycles, and as a consequence, the $V_{B2}$ cycles may correspond to a chemistry seeing a greater ratio of ions to electrons than seen in the $V_{B1}$ cycles (recall FIG. 4 where ion density and electron temperature will decay at different rates when the bias voltage is either turned off or lowered). The source pulsing has an on period of $T_{S2}$ and an off period of $T_{S3}$. During the second step, the electron temperature of the plasma is lower, which results in less breakup of the chemistry within the plasma.

A practical example for the source and bias voltages depicted in FIG. 14 includes using a fluorocarbon CxFy, Ar and $O_2$, during the $V_{B1}$ cycles, and the plasma chemistry is more fluorine rich. When combined with the higher sheath voltage ($V_{B1}$), faster etch rates result during the first step. The sheath voltage, $V_{B1}$, when etching may vary depending upon the type of etching that may be performed. Generally, a magnitude of the sheath voltage, $V_{B1}$, is greater than 1000V (e.g., 1500V), this may be typical for some conductor etch applications while some conductor etches may also demand values that are higher or lower. For some applications of dielectric etch, $V_{B1}$ may be 6000V or higher. But it is contemplated the sheath voltage, $V_{B1}$, may be 20,000V or higher. Deposition processes, such as those used for diamond-like-carbon (DLC) and similar films typically require sheath voltages that are less than 1000 Volts, as an example between 200 and 500 volts. Other DLC processes and those for other film types may require sheath voltages higher or lower than these values.

In the $V_{B2}$ cycles of the second step, in the CxFy, Ar and $O_2$ example, the chemistry is more polymerizing, and may be $CzF_2$ rich, and combined with the lower sheath voltage, $V_{B2}$, more side-wall polymer deposition results. During polymerization, the sheath voltage, $V_{B2}$, may be 1000V or less (e.g., between 500V and 1000V), and in some applications, $V_{B2}$, may be 500V or less (e.g., between 100V and 500V), and in yet other applications, $V_{B2}$, may be between 15V and 100V (e.g., 20V). These cycles alternate as shown. The choice of the phase timing and sheath voltages may be based upon the balance between duty cycles required not to overheat the substrate or process-hardware (from a high bias voltage) and the optimum etch rate and etched feature profile. An example of timings and bias voltages for an approximate 50% duty cycle on the bias power applied to the wafer could be 10 milliseconds for $T_{B3}$ and the first and second steps; $T_{B3}$ may be less than 5 microseconds; $V_{B1}$ may be at 1500V; $V_{B2}$ may be at 20V; and $T_{S2}$ and $T_{S3}$ may be approximately equal at 1 millisecond each. Different chemistries and process results could see the ratio of $T_{B1}$ and $T_{B2}$ vary from 5:95 to 95:5 respectively. While the CxFy, Ar and $O_2$ example cited is for anisotropic etching, the technique can be applied to other etch profiles and chemical systems, and also used for depositions and surface treatments where one wants periodic processing steps of highly dissociated plasma chemistry with a sheath voltage and less highly dissociated plasma chemistry with a lower sheath voltage.

Stated differently, the cycles of $V_{B1}$ and $V_{B2}$ show a change of the sheath voltage, though there are no "off" time frames, but rather time frames where the bias voltage $V_{B2}$ is less than $V_{B1}$ but non-zero. Thus, changing processing steps does not require a full powering off of the sheath voltage—any lowering of sheath voltage will influence the plasma chemistry. Further, while the sheath voltage changes from processing step to processing step, in some embodiments, two or more consecutive processing steps may be carried out before the RF excitation is pulsed. Another 'knob' includes adjusting a number of consecutive pulses at a given sheath voltage versus a number of consecutive pulses at another sheath voltage. Alternatively, other pulse patterns can be used, but where the chemistry is controlled by controlling an average amount of time that pulses reside at $V_{B1}$ versus $V_{B2}$. At the same time, all of these variations can be synchronized with pulsing of the source. For instance, the RF excitation source may be pulsed whenever a sheath voltage is at $V_{B2}$ and may be continuous whenever the bias pulse is at $V_{B1}$.

It has been described that it can be advantageous to pulse a source generator (e.g., an RF generator) to generate more polymerizing plasma chemistry to assist with the protection of the side wall of contacts and trenches being etched on a wafer. A further enhancement for side wall polymerization utilizing the bias supply 210 is to program the bias supply 210 to produce two sheath voltage peaks in the polymerization mode (e.g., during the second step of FIG. 14) to produce two peaks in the distribution of ion energies as illustrated in FIG. 6C. As discussed with reference to FIGS. 8A and 8B, to produce two peaks in the distribution of ion energies (and corresponding peaks in sheath voltage), a magnitude of a negative voltage swing of the periodic voltage function (applied by the bias supply) may alternate between two levels (as shown in FIG. 8B). For example, if there are 1000 cycles of the periodic voltage function (output by the bias supply 210) during the second step, 500 cycles may have a smaller negative voltage swing and 500 other cycles may have the larger negative voltage swing. The resultant ions of differing energy will have a higher probability to collide with each other and scatter onto the sidewall of the etched feature such as a contact hole or trench.

It is also contemplated that is beneficial for one (or both) of the two peaks have a particular range of ion energies (as opposed to monoenergetic peaks). As discussed above, this may be achieved by undercompensating or overcompensating for ion current (by changing the slope of the negative voltage ramp) of a cycle of the periodic voltage waveform that corresponds to the effectuated ion energy.

Figure 15:
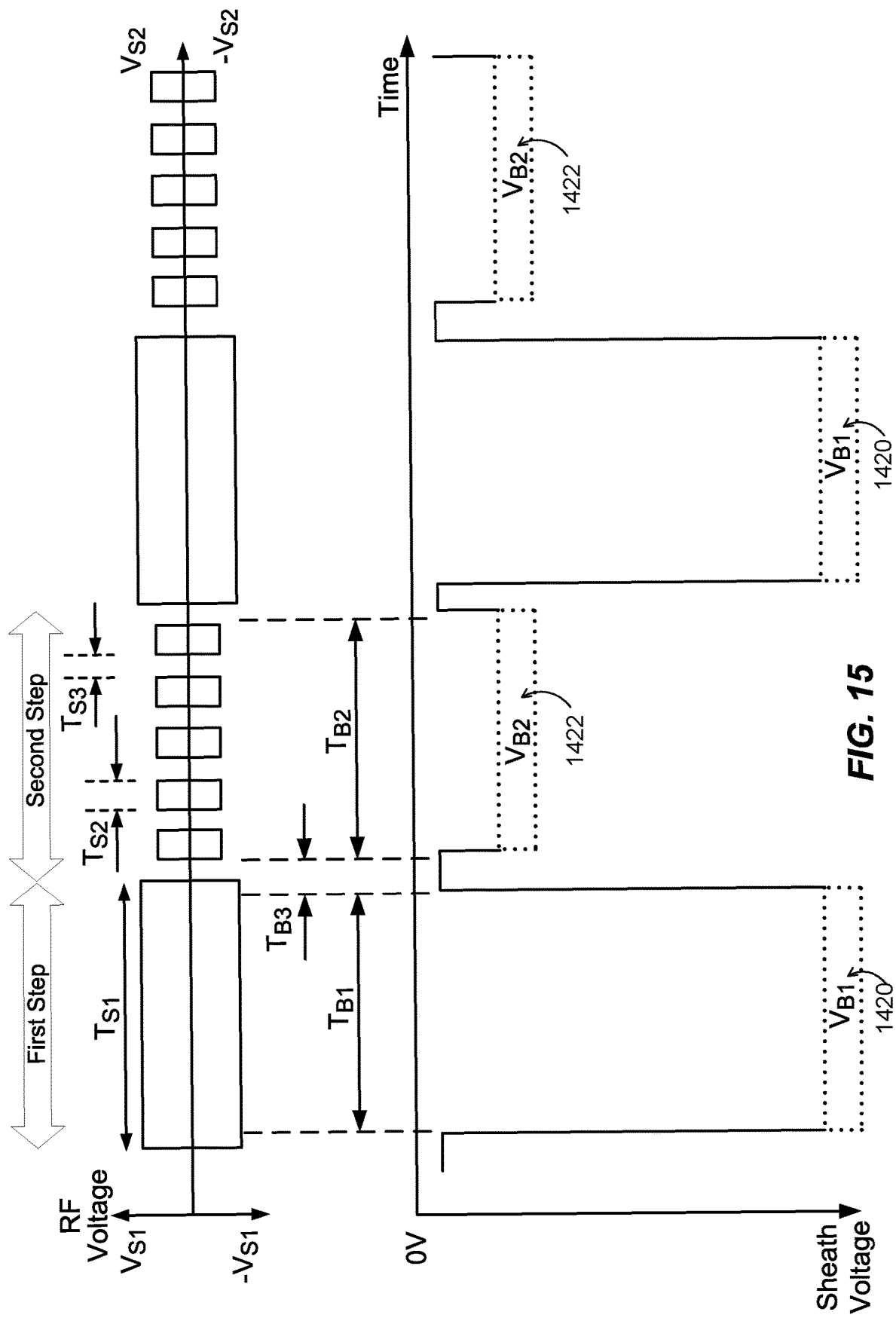
FIG. 15 depicts another exemplary RF voltage and exemplary sheath voltage.

FIG. 15 illustrates a variation where another 'knob' is introduced in the form of source voltage. During pulsing, the RF voltage is reduced. Alternatively, low RF voltage could be applied whenever the sheath voltage is at the lower $V_{B2}$ voltage.

Figure 16:
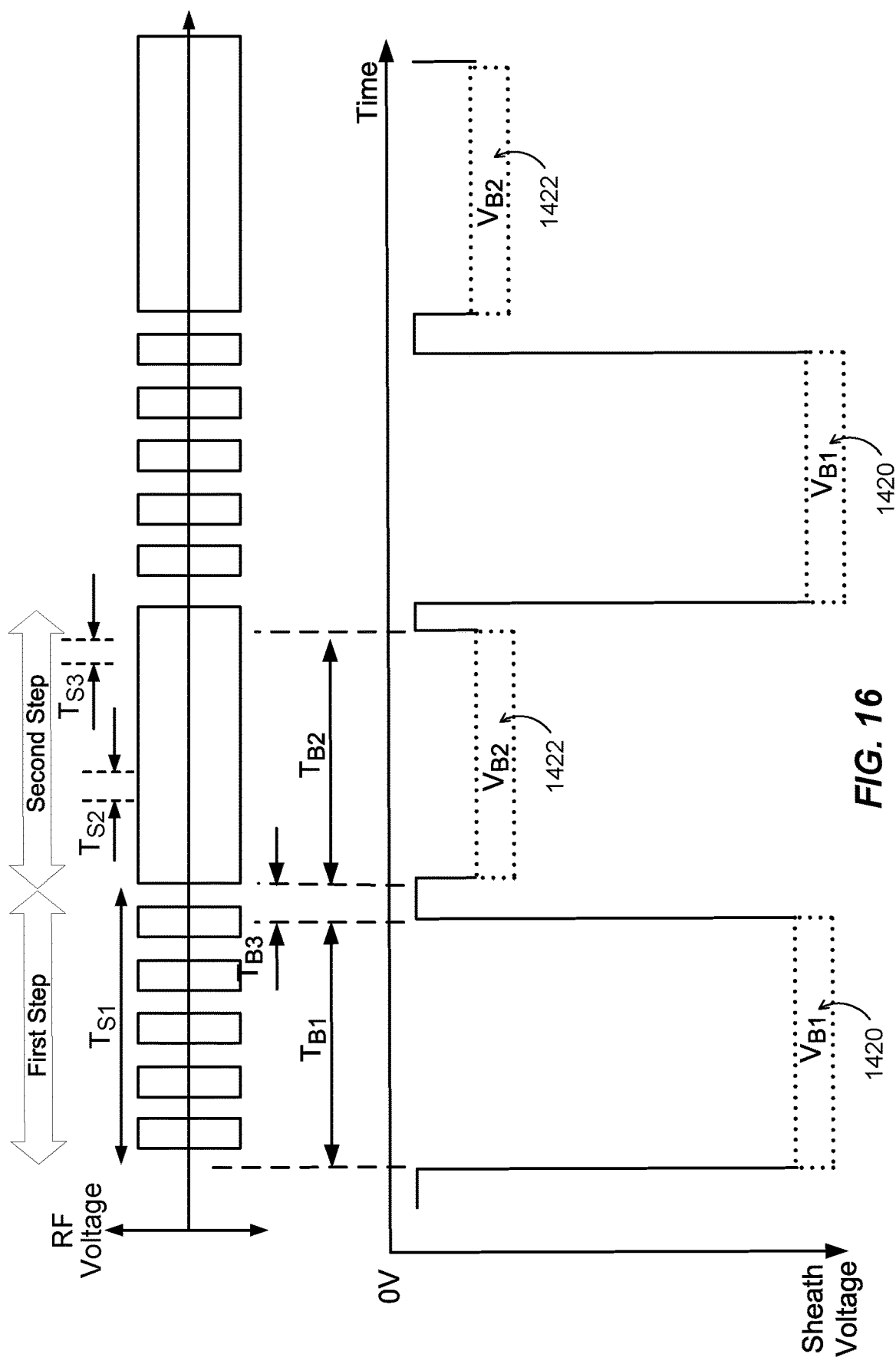
FIG. 16 depicts yet another exemplary RF voltage and exemplary sheath voltage.

FIG. 16 illustrates yet another variation, where pulsing of the source occurs during higher sheath voltages (e.g., the RF excitation source is pulsed during $V_{B1}$ cycles).

Figure 17:
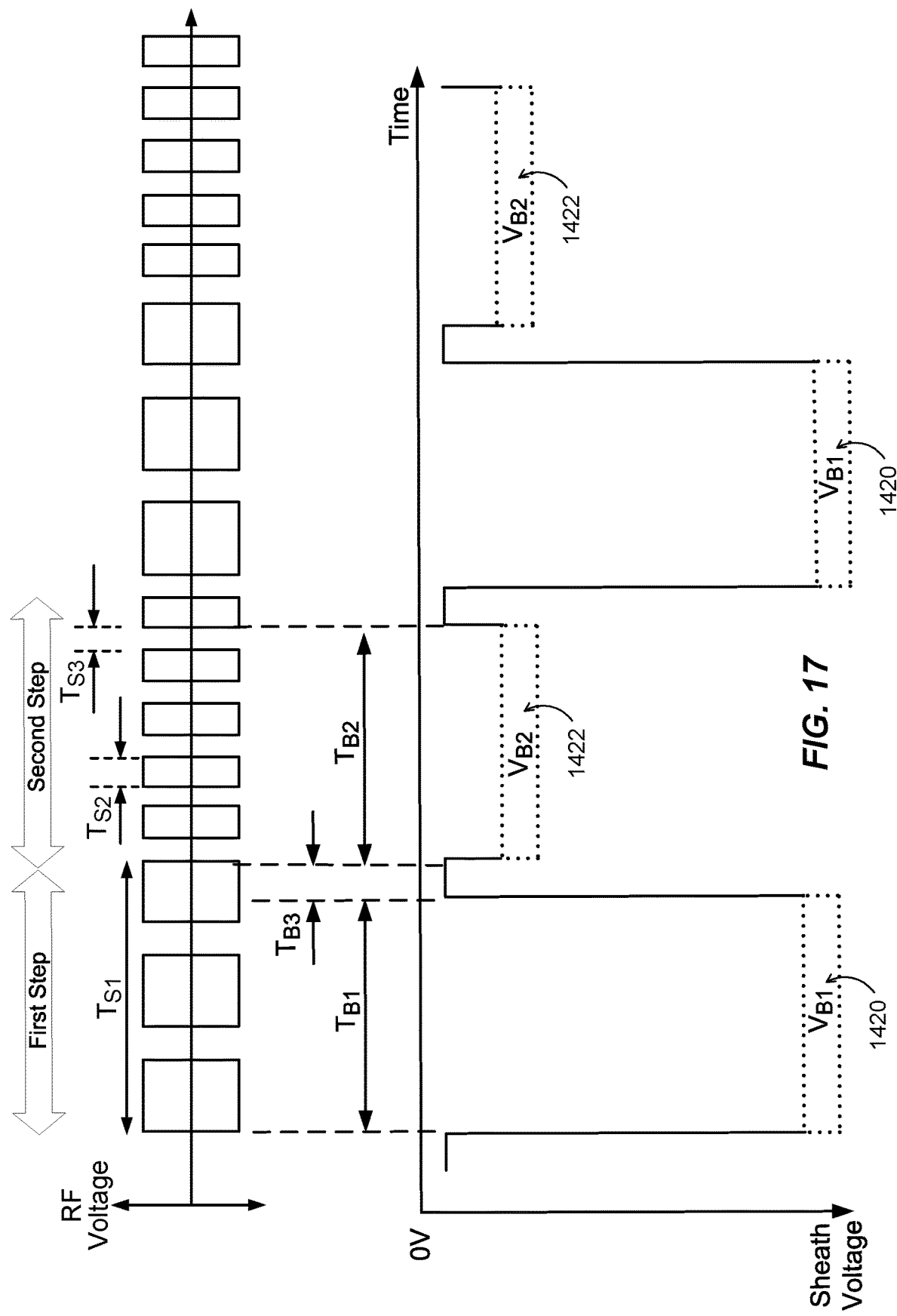
FIG. 17 depicts another exemplary RF voltage and exemplary sheath voltage.

FIG. 17 illustrates an alternative embodiment of the disclosure where the RF excitation source is pulsed both during $V_{B1}$ cycles and $V_{B2}$ cycles, but with a different duty for each of those processing steps. Specifically, the RF excitation source is pulsed with a longer duty cycle during $V_{B1}$ cycles and pulsed with a shorter duty cycle during $V_{B2}$ cycles. But a reverse correspondence could also be implemented. Further, this pulse pattern could be combined with changes to the source voltage synchronized to the bias pulse pattern.

Embodiments of this disclosure may be combined with systems, methods, and apparatus including multiple bias supplies and or multiple RF sources, each of these sources biasing a distinct electrode. For instance, a first bias supply could bias a substrate electrode under the substrate, while a second bias supply biases a ring electrode concentrically arranged around, but not in contact with, the substrate electrode. In another example, two RF sources could be used, each providing RF power to independent electrodes arranged near a top of the chamber (or a side of the chamber opposite from the substrate). In some cases, two or more pairs of bias supplies and corresponding electrodes, and two or more pairs of RF sources and corresponding electrodes may be implemented. In any of these scenarios, pulsing of the one or more RF sources and the one or more bias supplies, and changes in voltage from pulse-to-pulse can be synchronized. In some embodiments, a first bias supply and a first RF source may be synchronized, while a second bias supply and a second RF source are synchronized. In another instance, a first bias supply can be synchronized with first and second RF sources. In yet another instance, a first RF source can be synchronized with first and second bias supplies. But these concepts are not limited to two bias supplies or RF sources. Rather, many sources can be used, for instance, where complex, region-specific, control of plasma density (e.g., for the purpose of achieving plasma density uniformity) is desired. It should also be understood that the number of sources need not match the number of electrodes. For instance, four RF sources can drive three electrodes, or two RF sources can drive 5 electrodes, to give two non-limiting examples. Further, each source may have a corresponding match network, or a single match network may be coupled to and impedance match two or more sources. Where two or more electrodes are coupled to one or more bias supplies, these electrodes can be symmetric (e.g., concentric rings) or asymmetric (e.g., to account for asymmetries in the substrate and/or chamber).

Furthermore, where two or more bias supplies are implemented, each bias supply can be used to determine a localized ion current (and hence ion energy and ion density) and localized sheath capacitance.

Ion current, $I_1$ may be given as:

$$I_I = C_1 \frac{dVo}{dt} \qquad \text{(Equation 1)}$$

Sheath capacitance, $C_2$, may be given as:

$$C_2 = \frac{C_1 \cdot (I_I + I_c)}{I_c - C_1 \cdot \frac{dV_0}{dt}} \qquad \text{(Equation 2)}$$

Multiple bias supplies and their corresponding ability to measure ion current and hence ion density at different locations within the chamber can be utilized as feedback for the bias supplies and/or the RF sources. Alternatively, or in addition, this feedback can be used to control any electrical and/or mechanical feature of the processing chamber or sources. Alternatively, or in addition, this feedback can be used to control any one or more of the following: magnets of the processing chamber (e.g., magnets used to confine or shape the plasma, or magnets used to direct ions generated via a microwave plasma source); pressure control (e.g., pressure valves); mass flow control; gas flow control; gas chemistry control; and physical geometry of the chamber or components therein (e.g., vertical movement of the grounded silicon cap or lid). It will further be appreciated that in depth descriptions of the various known RF sources (e.g., capacitive, inductive, microwave, etc.) is not appropriate here since these are well-known in the art. But the feedback and synchronization herein described is applicable to any known RF source.

In some embodiments where two or more bias supplies are implemented, one or more of the electrodes biased by these bias supplies may be arranged under or proximal to the substrate, thereby primarily effecting a desired bias on the substrate, while one or more additional electrodes biased by one or more additional bias supplies may be arranged away from the substrate, such they influence regional plasma density, but have less, if any, of an influence on substrate bias.

Synchronization between the RF source and bias supplies may entail lowering voltage or cutting off voltage at the end of a given pulse (such as the pulses depicted in FIGS. 7B and 8B) that is output by the bias supply. In other words, it may be desirable to avoid ending a pulse in the midst of a bias supply pulse. Alternatively, pulsing or periodic reductions in voltage, may start and end at the same point/phase in the bias supply pulse, but for different pulses. In other words, it may be desirable to set the pulse on length equal to an integer number of bias supply pulses, whether or not the envelope pulse is in phase with a start or end to an individual bias supply pulse.

In an embodiment, two electrodes arranged under or near the substrate, for biasing the substrate, may be driven from multiple bias supplies, but where the two or more bias supplies receive power from a single DC supply. In an embodiment, one or more bias supplies could be used to measure ion density, sheath capacitance, or other chamber parameters with a reference substrate or no substrate in the chamber. One or more processing runs could be carried out, and then the measurements can be repeated. In this way, changes to the chamber can be monitored.

The previously described embodiments provide novel and nonobvious systems and methods to create laminate films, among other use cases. Examples such as diamond like carbon, which when deposited with plasma processing has very high stresses that can result in peeling of the film, can now be processed to incorporate low stress graphite or amorphous carbon layers so that the overall film still exhibits diamond like carbon properties but at lower stresses. In some films, it may be desirable to deposit the film in one period followed by a period where the plasma chemistry is modified by pulsing control and a high bias is applied to densify the film. Embodiments disclosed herein enable production of nano-level "Bragg" structures including alternative layers with different optical properties produced by combining pulsing and bias voltage control in each respective period as illustrated earlier. Said another way, a first chemistry can be achieved for a first processing step (e.g., during first period of time) to deposit a first layer, then a second chemistry can be achieved during a second processing step (for a second period of time) to deposit a second layer. This can be repeated numerous times to achieve a "Bragg" structure. The different chemistries can be achieved by variations in one or more of: sheath voltage; duty cycle of two or more bias voltages; alterations in the timing of sheath voltage; $T_{B1}$, $T_{B2}$, and $T_{B3}$, RF source pulsing; duty cycle of source pulsing; source voltage; and source voltage and pulsing in combination.

Figure 18:
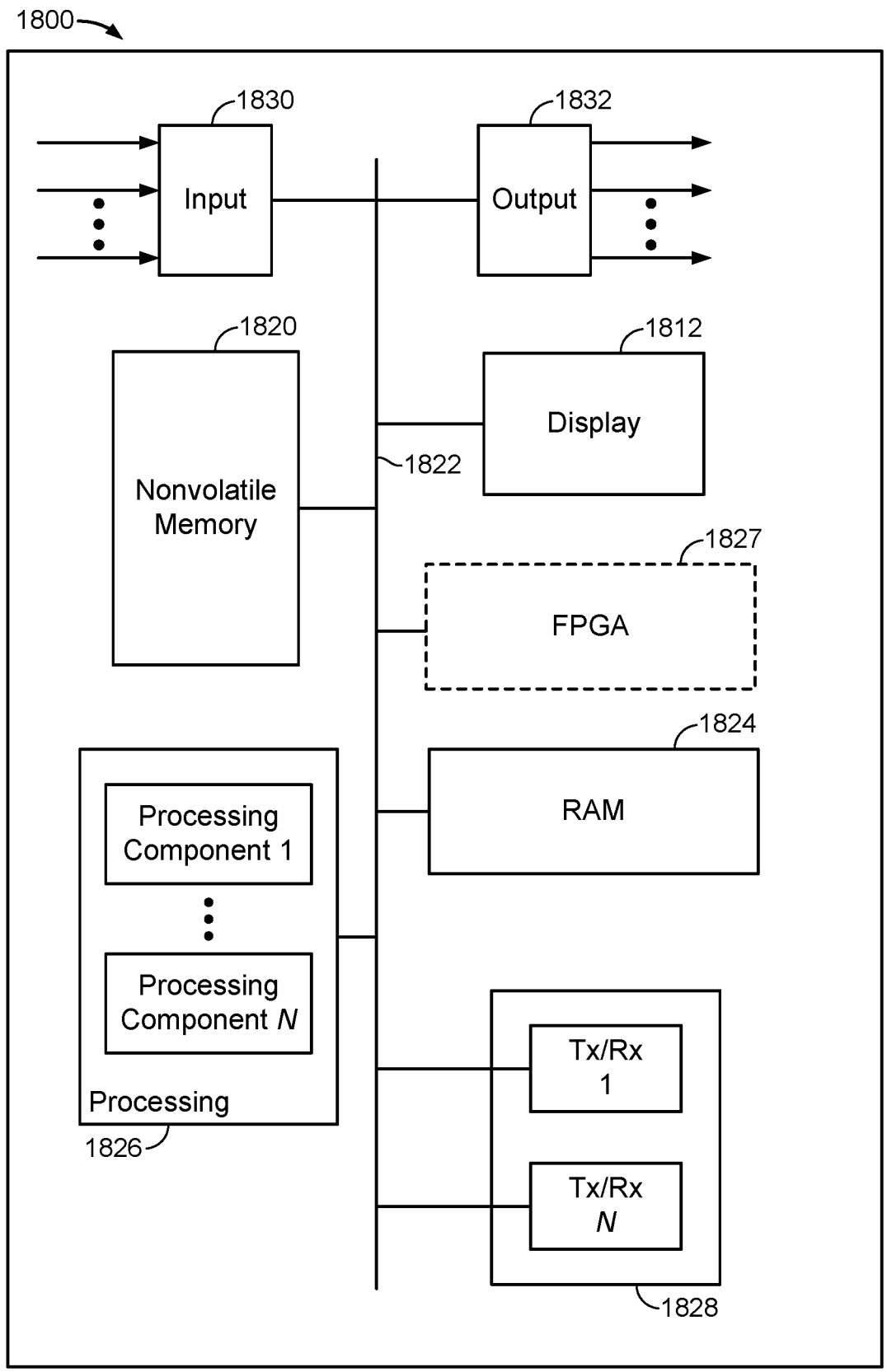
FIG. 18 is a block diagram illustrating components that may be utilized to implement control aspects disclosed herein.

The methods described in connection with the embodiments disclosed herein may be implemented by hardware, in processor-executable code encoded in a non-transitory tangible processor readable storage medium, or in a combination of the two. Referring to FIG. 18 for example, shown is a block diagram depicting physical components that may be utilized to realize (in part) the DC power supply units described above (e.g., 220), the bias supplies (e.g., bias supply 210), and/or the RF sources (e.g., the RF excitation source 230) according to an exemplary embodiment. As shown, in this embodiment a display portion 1812 and nonvolatile memory 1820 are coupled to a bus 1822 that is also coupled to random access memory ("RAM") 1824, a processing portion (which includes N processing components) 1826, an optional field programmable gate array (FPGA) 1827, and a transceiver component 1828 that includes N transceivers. Although the components depicted in FIG. 18 represent physical components, FIG. 18 is not intended to be a detailed hardware diagram; thus, many of the components depicted in FIG. 18 may be realized by common constructs or distributed among additional physical components. Moreover, it is contemplated that other existing and yet-to-be developed physical components and architectures may be utilized to implement the functional components described with reference to FIG. 18.

This display portion 1812 generally operates to provide a user interface for a user, and in several implementations, the display is realized by a touchscreen display. In general, the nonvolatile memory 1820 is non-transitory memory that functions to store (e.g., persistently store) data and processor-executable code (including executable code that is associated with effectuating the methods described herein). In some embodiments for example, the nonvolatile memory 1820 includes bootloader code, operating system code, file system code, and non-transitory processor-executable code to facilitate the execution of a method of synchronously pulsing an excitation source with the periodic asymmetric voltage waveform of the bias supply. For example, the control method depicted in FIG. 13 (and variations described with reference to FIGS. 14-17) may be implemented in part by processor executable code that is stored in the nonvolatile memory 1820.

In many implementations, the nonvolatile memory 1820 is realized by flash memory (e.g., NAND or ONENAND memory), but it is contemplated that other memory types may be utilized as well. Although it may be possible to execute the code from the nonvolatile memory 1820, the executable code in the nonvolatile memory is typically loaded into RAM 1824 and executed by one or more of the N processing components in the processing portion 1826.

The N processing components in connection with RAM 1824 generally operate to execute the instructions stored in nonvolatile memory 1820 to enable synchronous pulsing of an excitation source and bias supply. For example, non-transitory, processor-executable code to effectuate methods of synchronously pulsing and changing one or more characteristics of the excitation-source output and bias supply output may be persistently stored in nonvolatile memory 1820 and executed by the N processing components in connection with RAM 1824. As one of ordinarily skill in the art will appreciate, the processing portion 1826 may include a video processor, digital signal processor (DSP), microcontroller, graphics processing unit (GPU), or other hardware processing components or combinations of hardware and software processing components (e.g., an FPGA or an FPGA including digital logic processing portions).

In addition, or in the alternative, the processing portion 1826 may be configured to effectuate one or more aspects of the methodologies described herein (e.g., methods of synchronously pulsing and changing aspects of the power of the excitation and sheath voltages). For example, non-transitory processor-readable instructions may be stored in the nonvolatile memory 1820 or in RAM 1824 and when executed on the processing portion 1826, cause the processing portion 1826 to perform methods of synchronously pulsing and changing aspects of power (e.g., voltage and/or current) of the excitation and bias supplies. Alternatively, non-transitory FPGA-configuration-instructions may be persistently stored in nonvolatile memory 1820 and accessed by the processing portion 1826 (e.g., during boot up) to configure the hardware-configurable portions of the processing portion 1826 to effectuate functions disclosed herein (e.g., functions of the controller 1216 and controller 2460 described further herein).

The input component 1830 operates to receive signals (e.g., the synchronization signals on cable 260 or the power control and data signals on communication cable 250) that are indicative of one or more aspects of the synchronized control between the excitation source and the bias supply. The signals received at the input component may include, for example, the synchronization signals on cable 260, the power control and data signals on communication cable 250, or control signals from a user interface. The output component generally operates to provide one or more analog or digital signals to effectuate an operational aspect of the synchronization between the RF source and the bias supply. For example, the output portion 1832 may provide the synchronization signal between the bias supply 210 and the RF source 230 described with reference to FIG. 11.

The depicted transceiver component 1828 includes N transceiver chains, which may be used for communicating with external devices via wireless or wireline networks.

Each of the N transceiver chains may represent a transceiver associated with a particular communication scheme (e.g., WiFi, Ethernet, Profibus, etc.).

Figure 19:
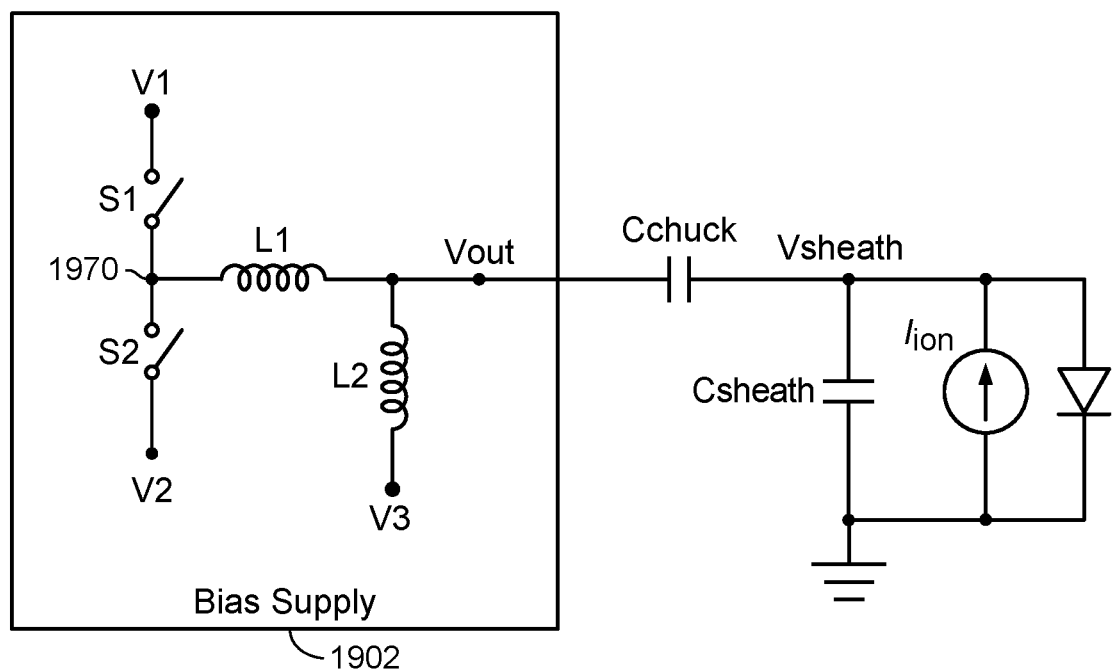
FIG. 19 is a diagram depicting aspects of an exemplary bias supply.

Referring next to FIG. 19, shown is a general representation of an exemplary bias supply 1902 that may be used to realize the bias supply 210. As shown, the bias supply 1902 utilizes three voltages V1, V2, and V3. Although not shown for clarity, the two switches S1, and S2 may be controlled by a switch controller via electrical or optical connection to enable the switch controller to open and close the switches, S1, S2, as disclosed below. The depicted switches S1, S2 may be realized by single pole, single throw, normally open switches, and as a non-limiting example, the switches S1, S2 may be realized by insulated gate bipolar transistors (IGBTs).

In this implementation, the voltages V1, V2, and V3 may be DC sourced voltages. As shown, the first switch, S1, is disposed to switchably connect the first voltage, V1, to a common node 1970 (that is common to S1 and S2), and the second switch, S2, is disposed to switchably couple the second voltage, V2, to the common node 1970. In addition, a first inductive element, L1, is disposed between the common node and an output node, Vout.

Figure 20:
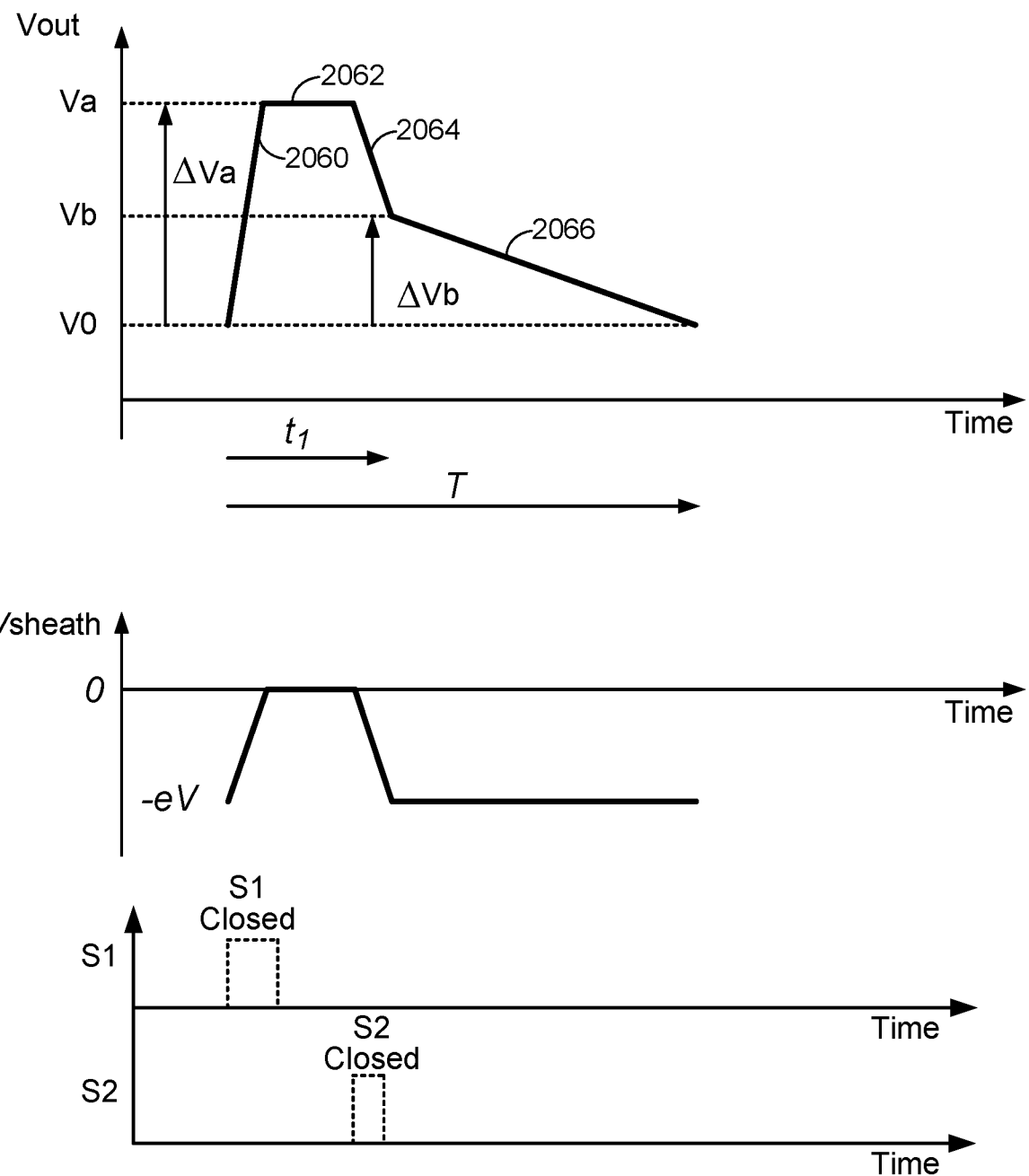
FIG. 20 includes a graph of a voltage waveform output from a bias supply; a graph of a corresponding sheath voltage; and a corresponding switch-timing diagram.

While referring to FIG. 19, simultaneous reference is made to FIG. 20, which depicts: 1) the asymmetrical voltage waveform of the bias supply 802 that is output at Vout; 2) a corresponding sheath voltage; and 3) corresponding switch positions of switches S1 and S2. In operation, the first switch, S1, is closed to increase, along a first portion 2060 of the voltage waveform (between voltage V0 and Va) a level of the voltage at the output node, Vout, to a first voltage level, Va, that is maintained along a second portion 2062 of the waveform, and then the first switch, S1, is opened. The second switch, S2, is then closed to decrease, along a third portion 2064 of the waveform, the level of the voltage waveform at the output node, Vout, to a second voltage level, Vb, and then the second switch, S2, is opened so that S1 and S2 are open. As shown, the negative voltage swing along the third portion 2064 affects the sheath voltage (Vsheath); thus, a magnitude of Vb may be controlled to affect the sheath voltage in close proximity to an electrode plane coupled to Vout. Those of skill in the art in view will appreciate that Vb is controllable by controlling V1, but Vb is not equal to V1 by virtue of the effect of the inductor, L1.

In this embodiment, while the first and second switches S1, S2 are open, the third voltage, V3, is applied to the output node, Vout, through a second inductive element L2 to further decrease a level of the voltage at the output node along a fourth portion 2066 of the voltage waveform. As shown in FIG. 20, the negative voltage ramp along the fourth portion 2066 may be established to maintain the sheath voltage by compensating for ions that impact the substrate.

Thus, S1 momentarily connects and then disconnects the first voltage, V1, to the output, Vout, through the first inductive element L1, and after a period of time, S2 connects and then disconnects the second voltage (e.g., ground) to the output, Vout, through the first inductive element L1. The third voltage, V3, is coupled to the output, Vout, through a second inductive element L2. In this implementation, the first voltage, V1, may be higher than the third voltage V3, and the momentary connection and disconnection of the first voltage, V1, to the output Vout causes the voltage of the output, Vout, to increase along the first portion 2060 of the voltage waveform to a first voltage level, Va, and the first voltage level, Va, is sustained along the second portion of the waveform 2062. The first voltage level Va may be above the first voltage, V1, and the second voltage, V2, (e.g., ground) may be less than the first voltage level, Va. The momentary connecting and then disconnecting of the second voltage, V2, causes the voltage of the output to decrease at the third portion 864 to the second voltage level Vb that is below the second voltage, V2 (e.g., ground).

Figure 21:
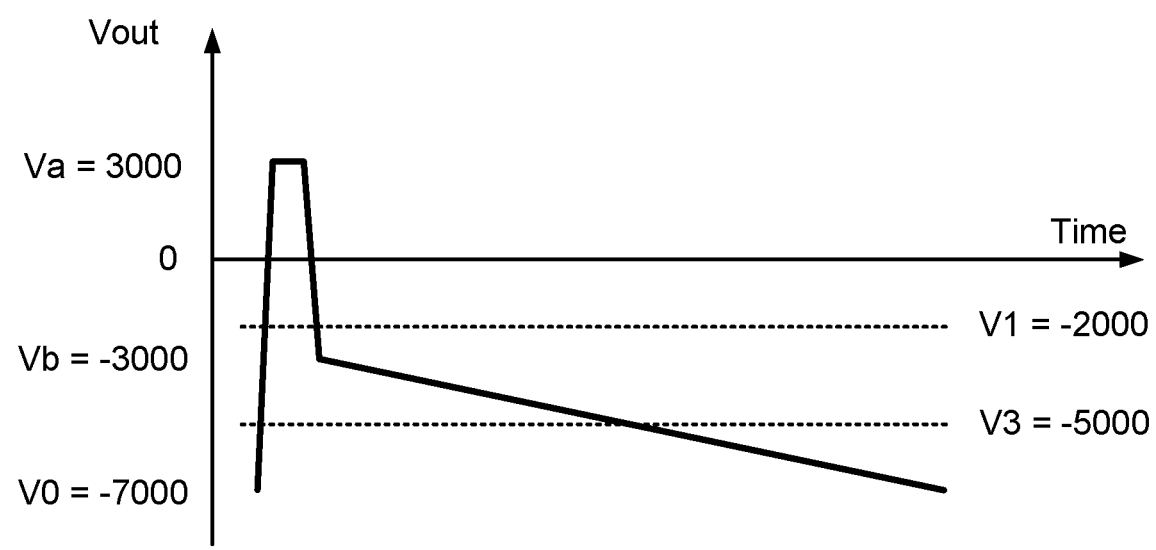
FIG. 21 is a graph depicting an exemplary bias supply waveform and exemplary voltage values.

As an example, as shown in FIG. 21, V1 may be −2000 VDC; V2 may be ground; V3 may be −5000 VDC; V0 may be −7000 VDC; Vb may be −3000 VDC; and Va may be 3000 VDC. But these voltages are merely exemplary to provide context to relative magnitude and polarities of the voltages described with reference to FIGS. 19 and 20.

Figure 22A:
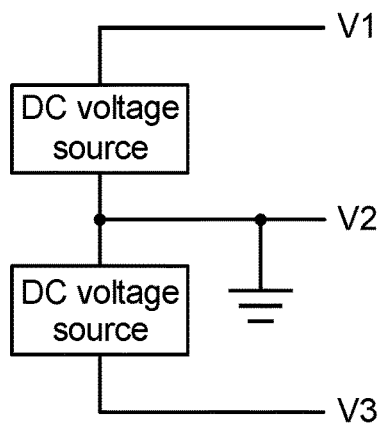
FIG. 22A depicts an implementation using two voltage sources to provide voltages to the bias supply depicted in FIG. 19.
Figure 22B:
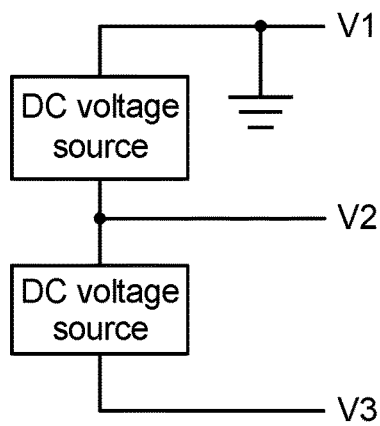
FIG. 22B depicts another implementation using two voltage sources to provide voltages to the bias supply depicted in FIG. 19.
Figure 22C:
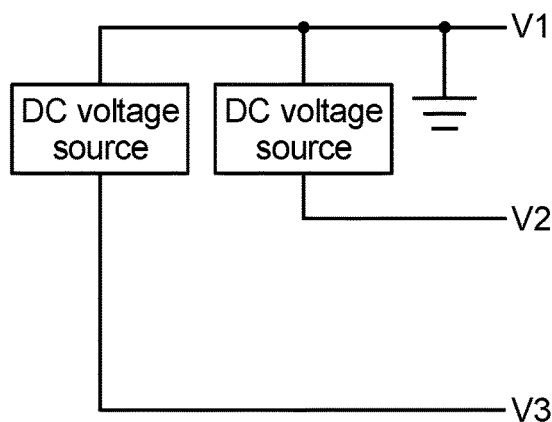
FIG. 22C depicts yet another implementation using two voltage sources to provide voltages to the bias supply depicted in FIG. 19.

Referring next to FIGS. 22A-22C shown are possible arrangements of two DC voltage sources to provide the voltages V1, V2, and V3 depicted in FIG. 19. In FIG. 22A, V2 is grounded and forms a common node between the two DC voltage sources. In FIG. 22B, V1 is grounded and V2 forms a common node between the DC voltage sources. And in FIG. 22C, V1 is grounded and forms a common node between each of the two DC voltage sources.

Figure 23A:
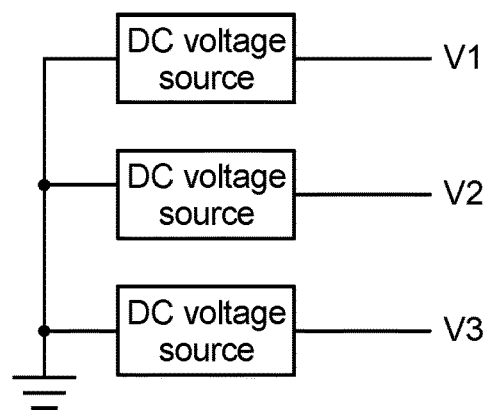
FIG. 23A depicts an implementation using three voltage sources to provide voltages to the bias supply depicted in FIG. 19.
Figure 23B:
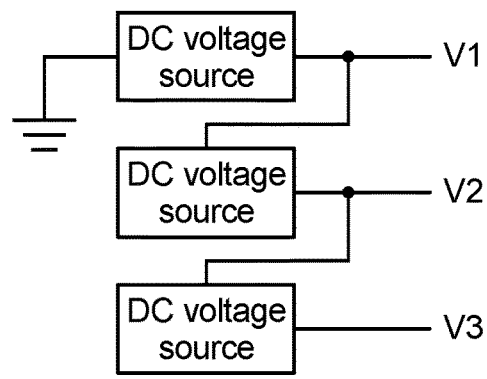
FIG. 23B depicts another implementation using three voltage sources to provide voltages to the bias supply depicted in FIG. 19.
Figure 23C:
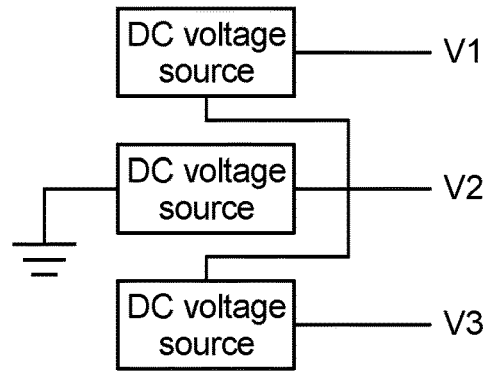
FIG. 23C depicts yet another implementation using three voltage sources to provide voltages to the bias supply depicted in FIG. 19.

In some embodiments, as shown in FIGS. 23A, 23B, and 23C, three DC voltage sources may be utilized to apply the three voltages V1, V2, and V3. As shown in FIG. 23A, each of the three DC voltage sources may be coupled to ground, and each of the three DC voltage sources provides a corresponding one of V1, V2, V3. In FIG. 23B one of the DC voltages sources is grounded and the three DC voltage sources are arranged in series. In FIG. 23C, one of DC voltages sources is disposed between ground and V2, and each of the DC voltage sources is coupled to V2.

Figure 24:
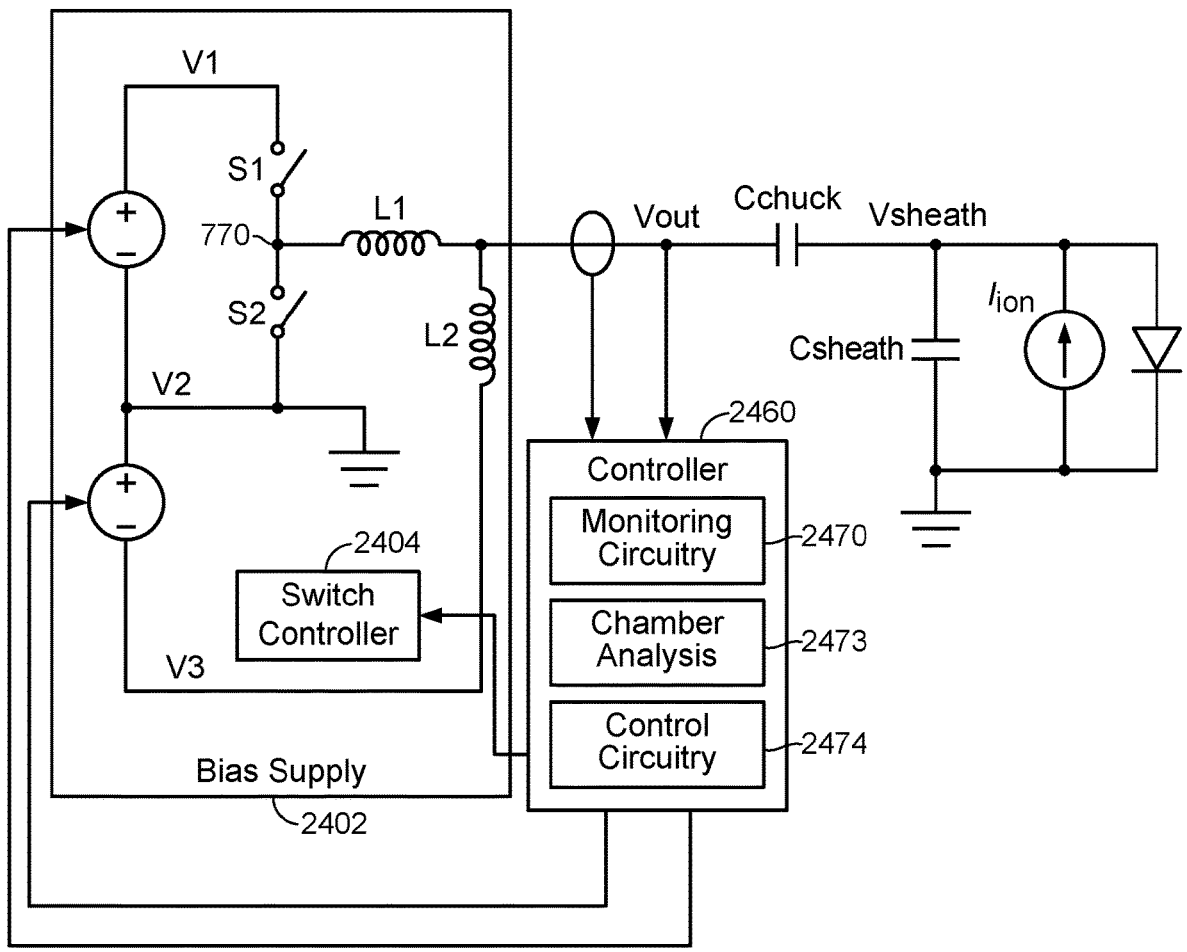
FIG. 24 depicts an exemplary bias supply.

Referring next to FIG. 24, shown is an exemplary bias supply 2402 that may be used to realize the bias supplies 210, 702. As shown, the bias supply 2402 includes a switch controller 2404 and two voltage sources to provide a first voltage V1, a second voltage V2, and a third voltage V3. Although not shown for clarity, the two switches S1, and S2 are coupled to the switch controller 2404 (e.g., via electrical or optical connection) to enable the switch controller 2404 to open and close the switches, S1, S2, as disclosed below. The depicted switches S1, S2 may be realized by single pole, single throw, normally open switches that are controllable by electrical or optical signal. As a non-limiting example, the switches S1, S2 may be realized by insulated gate bipolar transistors (IGBTs).

Also shown is an exemplary controller 2460 that may be realized within a housing of each bias supply or may be realized as a part of a centralized tool controller. As shown, the controller 2460 is coupled to receive information (e.g., voltage and/or current information) indicative of the power applied by the bias supply 2402 at the output, Vout, of the bias supply. As shown, the controller 2460 is also coupled to the switch controller 2404 and the two DC voltage sources to enable the controller 1260 to control the bias supply 2402 (e.g., to control the plasma sheaths proximate to the bias electrodes).

In addition, the controller 2460 includes monitoring circuitry 2470 to measure at least one characteristic of the power that is applied by the bias supply 2402, and a chamber analysis component 2472 configured to calculate a characteristic of an environment within the plasma processing chamber 10 based upon the measured characteristic of the power obtained from the monitoring circuitry 2470. Also shown in the controller 2460 is control circuitry 2474 to adjust the power applied by the bias supply 2402 to control the plasma sheaths proximate to the bias electrodes. In FIG. 24, the controller 2460 and switch controller 2404 are depicted as separate constructs, but it should be recognized that the controller 2460 and switch controller 2404 may be integrated and/or share common underlying components. For example, the controller 2460 and switch controller 2404 may be collocated on the same printed circuit board. As another example, the controller 2460 and switch controller may be realized by a system that includes an architecture similar to, or the same as, the computing device depicted in FIG. 18.

The monitoring circuitry 2470 may include one or more sensors such as a directional coupler, V-I sensor, phase and gain sensor, voltage sensor, and a current sensor. As one of ordinary skill in the art will appreciate, the measured characteristic of power may include, voltage, current, phase, and power. In addition, the monitoring circuitry 2470 may include analog-to-digital conversion components to convert analog signals from the sensor(s) to digital representations of the measured characteristic of the power. In other implementations, the sensor(s) are separate from the controller 2460, and the monitoring circuitry 2470 includes analog-to-digital conversion components to convert analog signals from the sensor(s) to digital representations of the measured characteristic of the power. In yet other implementations, the sensor(s) include sensing elements and analog-to-digital conversion components, and the monitoring circuitry 2470 may receive the digital representation of the characteristic of the power. The monitoring of one or more characteristics of the environment of the plasma processing chamber may include measuring (with the monitoring circuitry 2470) at least one characteristic of the power that is applied by the at least one bias supply.

The chamber analysis component 2472 is generally configured to determine a characteristic of an environment within the plasma processing chamber based upon the measured characteristic of the power obtained from the monitoring circuitry 2470. Although power may be measured (by the monitoring circuitry 2470) at a location that is exterior to the plasma processing chamber 100, the measured power characteristic may be used to calculate the characteristic of an environment within the plasma processing chamber 100. For example, using Equation 1, ion current in a region proximate to a bias zone may be calculated using measurements of voltage at Vout in connection with C1. As another example, using Equation 2, sheath capacitance in a region proximate to a bias zone may be calculated.

The control circuitry 2474 generally operates to adjust the power applied by the bias supply to adjust an aspect of the environment within the plasma processing chamber 100. For example, the plasma sheath proximate to a zone (established by the bias supply 2402) may be adjusted, and/or ion current may also be adjusted. As shown, the controller 2460 may be coupled to the DC voltage sources and the switch controller 2404; thus, with reference to FIG. 20, the controller 2460 may be used to adjust the voltage, Va, the voltage Vb, t1, T, and the slope of the fourth portion 2066. As discussed with reference to FIG. 20, the voltage of the plasma sheath in proximity to a bias zone associated with the bias supply 2402 may be adjusted.

Referring again to FIG. 24, in this implementation (which incorporates the embodiment depicted in FIG. 22A), the second voltage, V2, is provided at a node that is coupled to two DC voltage sources and coupled to ground, but in other implementations (e.g., described above with reference to FIGS. 22B and 22C) the second voltage, V2, need not be ground. As shown, the first switch, S1, is disposed to switchably connect the first voltage, V1, to the common node 770 (that is common to S1 and S2), and the second switch, S2, is disposed to switchably couple the second voltage, V2, to the common node 1970. In addition, the first inductive element, L1, is disposed between the common node and an output node, Vout.

In operation, the switch controller 2404 is configured close the first switch, S1, to increase, along a first portion 2060 of the voltage waveform (between a voltage $V_0$, and Va) a level of the voltage at the output node, Vout, to a first voltage level, Va, that is maintained along the second portion 2062 of the waveform, and then the first switch, S1, is opened. The switch controller 2404 then closes the second switch, S2, to decrease, along a third portion 864 of the waveform, the level of the voltage waveform at the output node, Vout, to a second voltage level, Vb, and then the switch controller 704 opens the second switch, S2, so that S1 and S2 are open. As shown, the negative voltage swing along the third portion 864 affects the sheath voltage (Vsheath); thus, a magnitude of Vb may be controlled to affect the sheath voltage in close proximity to the electrode plane coupled to Vout. Those of skill in the art will appreciate that Vb is controllable by controlling V1, but Vb is not equal to V1 by virtue of the effect of the inductor, L1, in this implementation.

In this embodiment, the second voltage source functions as an ion compensation component to apply, at least while the first and second switches S1, S2 are open, the third voltage, V3, to the output node, Vout, through a second inductive element L2 to further decrease a level of the voltage waveform at the output node along a fourth portion 866 of the voltage waveform. As shown in FIG. 20, the negative voltage ramp along the fourth portion 2066 may be established to maintain the sheath voltage by compensating for ions that impact the substrate.

Thus, S1 momentarily connects and then disconnects the first voltage, V1, to the output, Vout, through the first inductive element L1, and after a period of time, S2 connects and then disconnects the second voltage (e.g., ground) to the output, Vout, through the first inductive element L1. The third voltage, V3, is coupled to the output, Vout, through a second inductive element L2. In this implementation, the first voltage, V1, may be higher than the third voltage V3, and the momentary connection and disconnection of the first voltage, V1, to the output Vout causes the voltage of the output, Vout, to increase along the first portion 860 of the voltage waveform to a first voltage level, Va, and the first voltage level, Va, is sustained along the second portion of the waveform 2062. The first voltage level Va may be above the first voltage, V1, and the second voltage, V2, (e.g., ground) may be less than the first voltage level, Va. The momentary connecting and then disconnecting of the second voltage, V2, causes the voltage of the output to decrease at the third portion 2064 to the second voltage level Vb that is below the second voltage, V2 (e.g., ground).

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

As used herein, the recitation of "at least one of A, B or C" is intended to mean "either A, B, C or any combination of A, B and C." The previous description of the disclosed embodiments is provided to enable any person skilled in the art to make or use the present disclosure. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

What is claimed is:

1. A method for plasma processing, the method comprising:
applying pulsed RF power to a plasma processing chamber with an excitation source at a plurality of pulsing levels each having a frequency and a duty cycle; and
applying, synchronously during the plurality of pulsing levels, an asymmetric periodic voltage waveform with a bias supply to affect a control of a plasma sheath voltage during each of the plurality of pulsing levels.

2. The method of claim 1, wherein the asymmetric periodic voltage waveform is applied synchronously during the plurality of pulsing levels to produce a constant plasma sheath voltage that is a same magnitude for each of the plurality of pulsing levels.

3. The method of claim 1, wherein the asymmetric periodic voltage waveform is applied synchronously during the plurality of pulsing levels to produce a time-varying plasma sheath voltage for one or more of the plurality of pulsing levels.

4. The method in claim 1, wherein the asymmetric periodic voltage waveform is applied synchronously during the plurality of pulsing levels to produce a constant plasma sheath voltage that is a different magnitude for each of the plurality of pulsing levels.

5. The method of claim 1, wherein the asymmetric periodic voltage waveform is applied synchronously during the plurality of pulsing levels to produce a time-varying plasma sheath voltage for one or more of the plurality of pulsing levels.

6. The method of claim 1 wherein the asymmetric periodic voltage waveform is applied synchronously during the plurality of pulsing levels with a positive or negative time offset with respect to each of the plurality of pulsing levels.

7. The method of claim 3 wherein the asymmetric periodic voltage waveform is applied synchronously during the plurality of pulsing levels with a positive or negative time offset with respect to each of the plurality of pulsing levels.

8. The method of claim 4 where the asymmetric periodic voltage waveform is applied synchronously during the plurality of pulsing levels with a positive or negative time offset with respect to each of the plurality of pulsing levels.

9. The method of claim 5 where the asymmetric periodic voltage waveform is applied synchronously during the plurality of pulsing levels with a positive or negative time offset with respect to each of the plurality of pulsing levels.

10. A plasma processing system, the system comprising:
a bias supply configured to apply and modify an asymmetric periodic voltage waveform to a substrate support to modify a plasma sheath voltage between the plasma and a substrate within a plasma processing chamber; and
at least one controller configured to:
applying pulsed RF power to a plasma processing chamber with an excitation source at a plurality of pulsing levels each having a frequency and a duty cycle; and
applying, synchronously during the plurality of pulsing levels, an asymmetric periodic voltage waveform with a bias supply to affect a control of a plasma sheath voltage during each of the plurality of pulsing levels.

11. The plasma processing system of claim 10, wherein the at least one controller is configured to control the bias supply to apply the asymmetric periodic voltage waveform synchronously during the plurality of pulsing levels to produce a constant plasma sheath voltage that is a same magnitude for each of the plurality of pulsing levels.

12. The plasma processing system of claim 10, wherein the at least one controller is configured to control the bias supply to apply the asymmetric periodic voltage waveform synchronously during the plurality of pulsing levels to produce a time-varying plasma sheath voltage for one or more of the plurality of pulsing levels.

13. The plasma processing system of claim 10, wherein the at least one controller is configured to control the bias supply to apply the asymmetric periodic voltage waveform synchronously during the plurality of pulsing levels to produce a constant plasma sheath voltage that is a different magnitude for each of the plurality of pulsing levels.

14. The plasma processing system of claim 10, wherein the at least one controller is configured to control the bias supply to apply the asymmetric periodic voltage waveform synchronously during the plurality of pulsing levels to produce a time-varying plasma sheath voltage for one or more of the plurality of pulsing levels.

15. The plasma processing system of claim 10, wherein the at least one controller is configured to control the bias supply to apply the asymmetric periodic voltage waveform synchronously during the plurality of pulsing levels with a positive or negative time offset with respect to each of the plurality of pulsing levels.

16. A non-transitory computer-readable medium comprising instructions stored thereon, for execution by a processor, or for configuring a field programmable gate array, to perform plasma processing, the instructions including instructions to:
apply pulsed RF power to a plasma processing chamber with an excitation source at a plurality of pulsing levels each having a frequency and a duty cycle; and
apply, synchronously during the plurality of pulsing levels, an asymmetric periodic voltage waveform with a bias supply to affect a control of a plasma sheath voltage during each of the plurality of pulsing levels.

17. The non-transitory computer-readable medium of claim 16, wherein the asymmetric periodic voltage waveform is applied synchronously during the plurality of pulsing levels to produce a constant plasma sheath voltage that is a same magnitude for each of the plurality of pulsing levels.

18. The non-transitory computer-readable medium of claim 16, wherein the asymmetric periodic voltage waveform is applied synchronously during the plurality of pulsing levels to produce a time-varying plasma sheath voltage for one or more of the plurality of pulsing levels.

19. The non-transitory computer-readable medium in claim 16, wherein the asymmetric periodic voltage waveform is applied synchronously during the plurality of pulsing levels to produce a constant plasma sheath voltage that is a different magnitude for each of the plurality of pulsing levels.

20. The non-transitory computer-readable medium of claim 16, wherein the asymmetric periodic voltage waveform is applied synchronously during the plurality of pulsing levels to produce a time-varying plasma sheath voltage for one or more of the plurality of pulsing levels.

21. The non-transitory computer-readable medium of claim 16, wherein the asymmetric periodic voltage waveform is applied synchronously during the plurality of pulsing levels with a positive or negative time offset with respect to each of the plurality of pulsing levels.

\* \* \* \* \*